United States Patent
Alamaunu et al.

(10) Patent No.: US 7,823,048 B2
(45) Date of Patent: Oct. 26, 2010

(54) BUFFERING OF DATA FROM A DATA STREAM HAVING ERROR CORRECTION ELEMENTS

(75) Inventors: Jyrki Alamaunu, Turku (FI); Harri J. Pekonen, Raisio (FI); Mikko V. Savolainen, Niinijoki (FI)

(73) Assignee: Nokia Corporation, Espoo (FI)

( * ) Notice: Subject to any disclaimer, the term of this patent is extended or adjusted under 35 U.S.C. 154(b) by 1355 days.

(21) Appl. No.: 11/139,506

(22) Filed: May 31, 2005

(65) Prior Publication Data

US 2006/0268726 A1 Nov. 30, 2006

(51) Int. Cl.
*H03M 13/00* (2006.01)
*G11C 29/00* (2006.01)

(52) U.S. Cl. ..................... 714/776; 714/766
(58) Field of Classification Search .......... 714/766, 714/776
See application file for complete search history.

(56) References Cited

U.S. PATENT DOCUMENTS

| | | | | |
|---|---|---|---|---|
| 4,375,100 A | * | 2/1983 | Tsuji et al. | 714/755 |
| 4,686,690 A | * | 8/1987 | Sato | 375/365 |
| 4,707,805 A | * | 11/1987 | Narusawa et al. | 360/32 |
| 5,255,272 A | * | 10/1993 | Gill et al. | 714/765 |
| 5,258,853 A | * | 11/1993 | Nobuta et al. | 358/444 |
| 5,392,136 A | * | 2/1995 | Nobuta et al. | 358/444 |
| 5,432,800 A | * | 7/1995 | Kuroda et al. | 714/758 |
| 5,463,762 A | * | 10/1995 | Morrissey et al. | 714/49 |
| 5,751,741 A | * | 5/1998 | Voith et al. | 714/758 |
| 5,896,374 A | * | 4/1999 | Okumura et al. | 370/311 |
| 5,996,105 A | * | 11/1999 | Zook | 714/755 |
| 6,047,395 A | * | 4/2000 | Zook | 714/756 |
| 6,775,799 B1 | * | 8/2004 | Giorgetta et al. | 714/751 |
| 7,242,960 B2 | * | 7/2007 | van Rooyen | 455/552.1 |
| 7,286,794 B2 | * | 10/2007 | Van Rooyen | 455/3.06 |
| 7,313,414 B2 | * | 12/2007 | van Rooyen | 455/553.1 |

(Continued)

FOREIGN PATENT DOCUMENTS

GB 2401759 11/2004

(Continued)

OTHER PUBLICATIONS

International Search Report of PCT/IB2006/001107 dated Oct. 10, 2006.

(Continued)

*Primary Examiner*—Joseph D Torres
(74) *Attorney, Agent, or Firm*—Banner & Witcoff, Ltd

(57) ABSTRACT

Data for a second Multi-Protocol Encapsulation-Forward Error Correcting (MPE-FEC) data frame is received while application data from a first MPE-FEC frame is undergoing error correction. The incoming data is buffered in a supplemental buffer having a size smaller than that needed for an entire MPE-FEC frame. As the supplemental buffer is filled, additional data from the second frame is stored in a buffer previously used to store error correction data for the first MPE-FEC frame. When corrected application data from the first MPE-FEC frame is transferred from an application data buffer used to hold application data undergoing correction, the second MPE-FEC frame data is transferred from the supplemental and error correction data buffers to the application data buffer. Additional data for the second frame is then placed directly into the application and error correction data buffers.

39 Claims, 20 Drawing Sheets

U.S. PATENT DOCUMENTS

| | | | | |
|---|---|---|---|---|
| 7,324,832 | B2* | 1/2008 | van Rooyen | 455/552.1 |
| 7,421,244 | B2* | 9/2008 | van Rooyen | 455/3.02 |
| 7,430,438 | B2* | 9/2008 | van Rooyen | 455/552.1 |
| 7,444,165 | B2* | 10/2008 | van Rooyen | 455/552.1 |
| 7,447,980 | B2* | 11/2008 | Xu et al. | 714/776 |
| 7,450,900 | B2* | 11/2008 | van Rooyen | 455/3.06 |
| 2006/0088111 | A1* | 4/2006 | Ye et al. | 375/260 |
| 2006/0128330 | A1* | 6/2006 | Rooyen et al. | 455/180.2 |
| 2006/0128331 | A1* | 6/2006 | Rooyen | 455/188.2 |
| 2006/0128332 | A1* | 6/2006 | van Rooyen et al. | 455/188.2 |
| 2006/0128393 | A1* | 6/2006 | Rooyen | 455/452.2 |
| 2006/0128424 | A1* | 6/2006 | Rooyen | 455/552.1 |
| 2006/0262810 | A1* | 11/2006 | Vadakital et al. | 370/473 |

FOREIGN PATENT DOCUMENTS

| | | |
|---|---|---|
| GB | 2402307 | 12/2004 |
| GB | 2406483 | 3/2005 |
| WO | 2004086670 | 10/2004 |
| WO | 2006030329 | 3/2006 |

OTHER PUBLICATIONS

Written Opinion of PCT/IB2006/001107 dated Oct. 10, 2006.
ETSI EN 301 192 v1.4.1, titled "Digital Video Broadcasting (DVB); DVB specification for data broadcasting," Nov. 2004.
ETSI EN 302 304 v1.1.1, titled "Digital Video Broadcasting (DVB); Transmission System for Handheld Terminals (DVB-H)," Nov. 2004.
Kornfeld, M. and Reimers, U, "DVB-H—the emerging standard for mobile data communication," EBU Technical Review, Jan. 2005.
Kornfeld, M., "DVB-H—The emerging standard for mobile data communication," date of first publication unknown, but prior to May 31, 2005.

* cited by examiner

Prior art MPE-FEC data
frame organization

BUFFERING OF DATA FROM A DATA STREAM HAVING ERROR CORRECTION ELEMENTS

FIELD OF THE INVENTION

The invention generally relates to storage of data. In particular, aspects of the invention pertain to allocation and management of memory resources used to buffer a portion of a data stream which has payload and error correction data elements.

BACKGROUND OF THE INVENTION

The Digital Video Broadcasting Handheld (DVB-H) standard defines a Multi-Protocol Encapsulation-Forward Error Correcting (MPE-FEC) data frame. An MPE-FEC frame is an organizational structure for data received by a mobile terminal or other device during a single time-slicing burst. As described in more detail below, an MPE-FEC frame includes two data tables. The first table holds application datagrams received during a burst of data. The second table holds error correction data (received during the same burst) that is used to correct errors in the application datagrams. The MPE-FEC frame is useful, e.g., in circumstances of high data packet loss. The MPE-FEC frame, which can be used in connection with video broadcast as well as other types of data, is generally described in European Telecommunications Standards Institute (ETSI) standard number EN 301 192 version 1.4.1 (titled "Digital Video Broadcasting (DVB); DVB specification for data broadcasting"). This standard, hereinafter referred to as EN 301 192, is available from ETSI at <http://www.etsi.org>.

The format of an MPE-FEC frame is shown in FIG. 1A. The first table in an MPE-FEC frame is an application data table (APDT). Application data in the APDT is typically (though not necessarily) being transmitted to a receiving device so as to provide some type of service to a device user. For example, the APDT data may be part of a video broadcast. The MPE-FEC frame is not limited to video broadcast, however, and the APDT table could be used to hold any type of data. For example, the APDT could hold data downloaded from the Internet, code for an application program being downloaded for installation on a mobile terminal, or any other type of data. The APDT is 191 columns wide, with the columns numbered 0 through 190.

The second table is a Reed-Solomon (RS) error correction data table (RSDT). The RSDT is 64 columns wide, with the columns numbered 0-63. The MPE-FEC frame (and thus the APDT and the RSDT) may have up to 1,024 rows. Each cell (i.e., each row/column intersection) of the MPE-FEC frame holds 8 bits (1 octet or byte) of data. The RSDT holds data which is used to correct transmission errors in the APDT data. As further explained below, the RSDT is filled (or partially filled) after the APDT has been filled (or partially filled and padded). Each row of data in the RSDT is then used to perform Reed-Solomon error correction on a corresponding row of the APDT.

FIGS. 1B-1E show how data is added to an MPE-FEC frame. Application data is transmitted to a mobile terminal (or other recipient device) in one or more data units known as a "datagram_section." The format for a datagram_section is also defined by EN 301 192. Included in each datagram_section are one or more bytes of application data. ETSI EN 301 192 refers to each of these bytes as an "IP_datagram_data_byte." A datagram refers to one or more application data bytes that are part of the same network layer (OSI layer 3) data frame. In the case of Internet Protocol data, a datagram is an IP datagram. A single datagram may span several datagram_sections, but will not (under EN 301 192) span multiple MPE-FEC frames. Also contained within a datagram_section (in fields labeled "MAC_address_4" through "MAC_address_1" by EN 301 192) are various "real-time parameters." One of these real-time parameters is an 18-bit value used to address a cell in the APDT. The datagram_section further contains a CRC (cyclic redundancy code) for the entire datagram_section.

As a datagram_section is received, it is checked for errors using the CRC in that datagram_section. Each IP_datagram_data_byte in the datagram_section is then placed into its proper location in the APDT based on the address included in the real-time parameters. The APDT cells are numbered consecutively, beginning with the cell at the intersection of row 0 and column 0, and then progressing down each column. When the bottom of a column is reached, the numbering continues at the top (row 0) of the next column. Thus, the cell at the bottom row of APDT column 0 would have address x, and the cell at the top (row 0) of column 1 would have address x+1. The first IP_datagram_data_byte of each datagram_section is placed in the cell located with the address information provided in that datagram_section. The remaining IP_datagram_data_bytes in the datagram_section are then placed in the following cells. This is shown schematically in FIG. 1B. In FIG. 1B, a first datagram_section ("datagram_section 1") for an MPE-FEC frame is received. The address in datagram_section 1, shown in decimal notation for convenience, is "0." The address information is actually an offset value from a memory address for the row 0, column 0 cell in the receiving device's memory. Thus, the first IP_datagram_data_byte ("byte a") in datagram_section 1 is placed in the APDT cell for row 0 and column 0. The remaining IP_datagram_data_bytes are then loaded into the succeeding cells. For simplicity, only three additional IP_datagram_data_bytes are shown in datagram_section 1 ("byte b" through "byte d"). However, a datagram_section may contain many more IP_datagram_data_bytes.

In FIG. 1C, the next datagram_section (datagram_section 2) is received. The address value in datagram_section 2 ("n") indicates the APDT cell for the first IP_datagram_data_byte (byte w) in datagram_section 2. The remaining IP_datagram_data_bytes are then loaded into the following APDT cells. Although FIG. 1C shows all of the application data from datagram section 1 placed in column 0, this need not be the case. For example, a datagram_section may contain IP_datagram_data_bytes that continue into the next column. This is shown in FIG. 1D, where IP_datagram_data_bytes from subsequent datagram_sections 3 through N have been loaded into the APDT. Some of the datagram_sections may have failed the CRC check. In FIG. 1D, the contents of datagram_section 9 were found to contain errors (indicated by crosshatching). However, this erroneous data is still loaded into the APDT for later RS correction, as described below. In some cases, and as also shown in FIG. 1D, some of the APDT cells may contain padding, i.e., NULL data.

After all data for the APDT is received (the final datagram_section will contain a "table_boundary" flag), data for the RSDT is received. RS data is transmitted, during the same burst in which the application data is received, in structures known as MPE-FEC_sections. The format for an MPE-FEC_section is also defined by EN 301 192. Unlike datagram_sections, which can contain IP_datagram_data_bytes filling a portion of an APDT column (or spanning multiple columns), each MPE-FEC_section contains bytes of data ("rs_data_bytes," not shown) for a single column of the RSDT. As seen in FIG. 1E, RS data is loaded into the RSDT, column-by-column, from successive MPE-FEC_sections. Although FIG. 1E shows the RSDT as completely filled, this will not always be the case. For example, some of the RSDT columns may be discarded (a procedure known as "puncturing") in order to reduce the bandwidth needed for parity data (at the expense of error correction capability).

Once the MPE-FEC table is completed, and as shown in FIGS. 1F and 1G, error correction can begin. Reed-Solomon error correction is performed row-by-row on each row of the APDT. In particular, RS data in a row of the RSDT is used to correct errors in the corresponding row of the ASDT. This proceeds downward until errors in the entire ASDT have been corrected. As shown in FIG. 1H, the corrected application data is then be transferred from the APDT to the appropriate application program (e.g., a video playback application). The MPE-FEC table is also ready to receive application and RS data (datagram_sections and MPE-FEC_sections) in connection with the next transmission burst.

The previously-described process can present challenges under certain conditions. The receiving device must have sufficient memory to buffer the APDT and RSDT until errors in the application data have been corrected and the application data has been forwarded to its destination. If the receiving device has not completed error-correction processing of the MPE-FEC frame data for one burst when a subsequent burst arrives, the data for the subsequent burst must also be buffered until processing of the previous burst data is completed. Under EN 301 192, an MPE-FEC frame can hold almost 2 Mbits of data (1024 rows*255 columns*8 bits). Typically, DVB-H compliant receivers simply allocate memory blocks in sizes that are multiples of the largest MPE-FEC frame (~2 Mbits). Received MPE-FEC frame data is then loaded into and processed from alternating ones of those multiple blocks. Because of physical device size constraints, however, memory is often limited in mobile terminals. Accordingly, a need remains for methods and systems reducing the memory space required to buffer data (such as MPE-FEC data) which may require (or be needed for) error correction.

SUMMARY OF THE INVENTION

At least some embodiments of the invention reduce the amount of memory space which must be reserved for buffering incoming data while previously-received data is processed to correct transmission errors. Certain embodiments of the invention can be implemented in connection with receipt of successive groupings of data (e.g., successive MPE-FEC frames) in which each data grouping includes multiple sets of payload data (e.g., an MPE-FEC application data table) and multiple sets of error correction data (e.g., an MPE-FEC RS data table). Each grouping is configured for arrangement according to a predefined tabular format in which each payload data set (e.g., each application data table row) is associated with a corresponding error correction data set (e.g., a corresponding RS data table row), with each error correction data set usable to correct its corresponding payload data set. As errors in payload data from a first data grouping are corrected, payload data from a second grouping is received. The second grouping payload data is buffered, pending the completion of error correction for the first grouping, without reserving a buffer for the second grouping having a capacity that equals or exceeds the maximum amount of data in the second grouping.

In some embodiments, the invention is implemented by reserving a supplemental data buffer. As payload data from the first grouping is being corrected, payload data from the second grouping is placed in the supplemental buffer. When the supplemental buffer is filled, additional payload data from the second grouping is placed in a buffer used to hold error correction data from the first grouping. When corrected payload data from the first grouping is transferred out of a payload data buffer used to hold payload data which is being corrected, payload data from the second grouping is transferred from the supplemental and error correction data buffers to the payload data buffer. As additional payload and error correction data from the second grouping is received, it is placed in its proper location in the payload or error correction data buffer.

In certain additional embodiments, the invention is implemented by not reconstructing received data groupings according to their predefined tabular format. For embodiments directed to MPE-FEC data, received application data and RS correction data is stored without arranging the data into corresponding application data and RS data tables. In these additional embodiments, received data is stored in arbitrary memory locations, and a linked list is used to identify payload and error correction data elements. If data from a second grouping is received while data from a first grouping is still undergoing error correction, the newly received data can also be stored in arbitrary memory locations.

BRIEF DESCRIPTION OF THE DRAWINGS

The foregoing summary of the invention, as well as the following detailed description of illustrative embodiments, is better understood when read in conjunction with the accompanying drawings, which are included by way of example, and not by way of limitation with regard to the claimed invention.

DETAILED DESCRIPTION OF THE PREFERRED EMBODIMENTS

Although embodiments of the invention will be described by example of DVB-H communications, the invention is not limited in this regard. In particular, the invention is also applicable to other communication schemes in which a data stream has payload and error correction elements. Similarly, any reference to particular data groupings or arrangements (e.g., MPE-FEC frames) or to aspects of a specific format (e.g., the number of columns or rows in a frame, the number of bits in a particular data field) is by way of illustration only. The invention is not limited to the specific data groupings, arrangements or formats described.

Figure 1A:
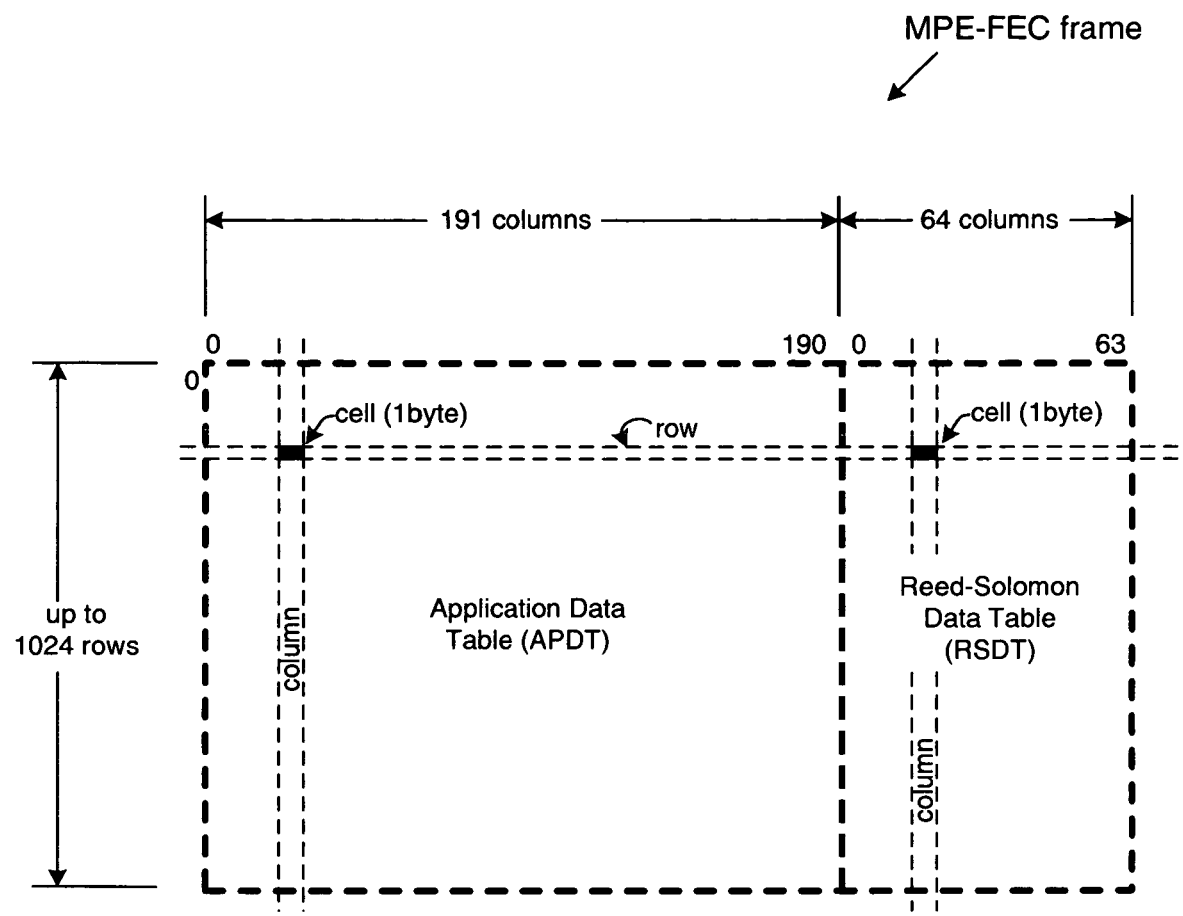
FIG. 1A is a diagram showing the format of a Multi-Protocol Encapsulation-Forward Error Correcting (MPE-FEC) data frame.
Figure 1B:
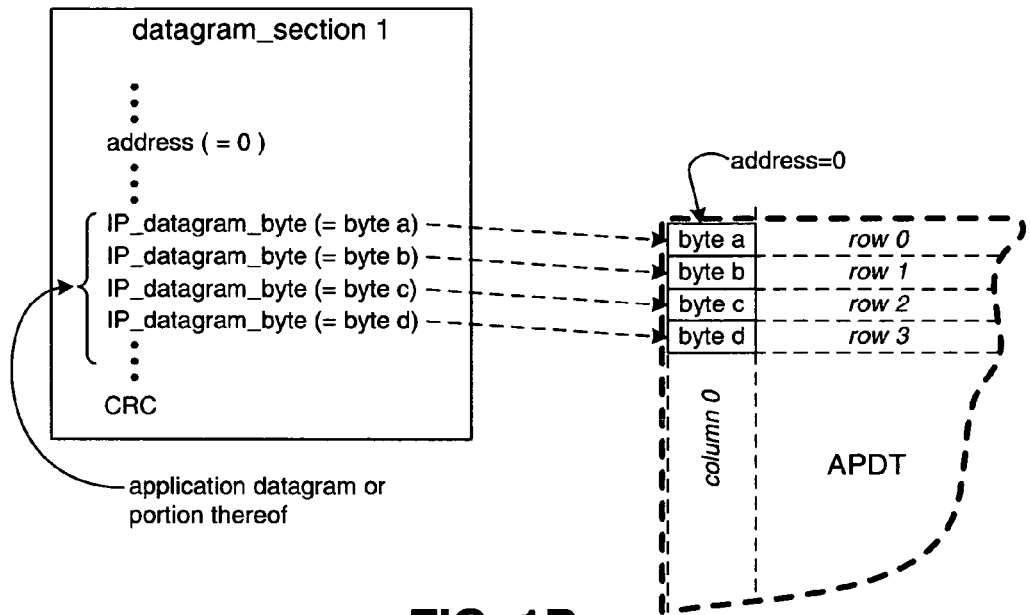
FIGS. 1B-1H are diagrams showing loading, error correction processing and emptying of an MPE-FEC data frame.
Figure 1C:
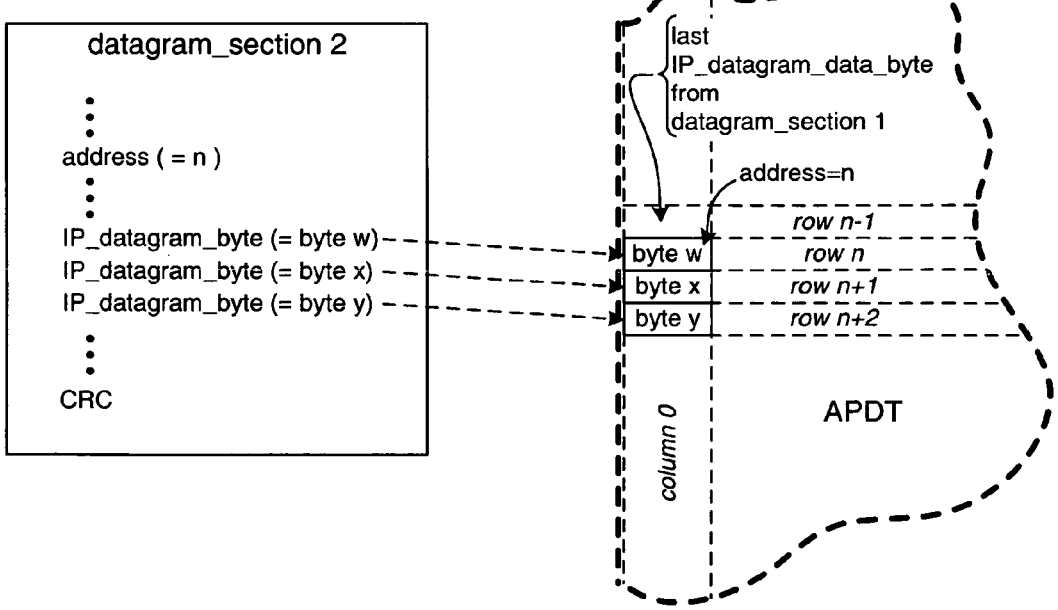
Figure 1D:
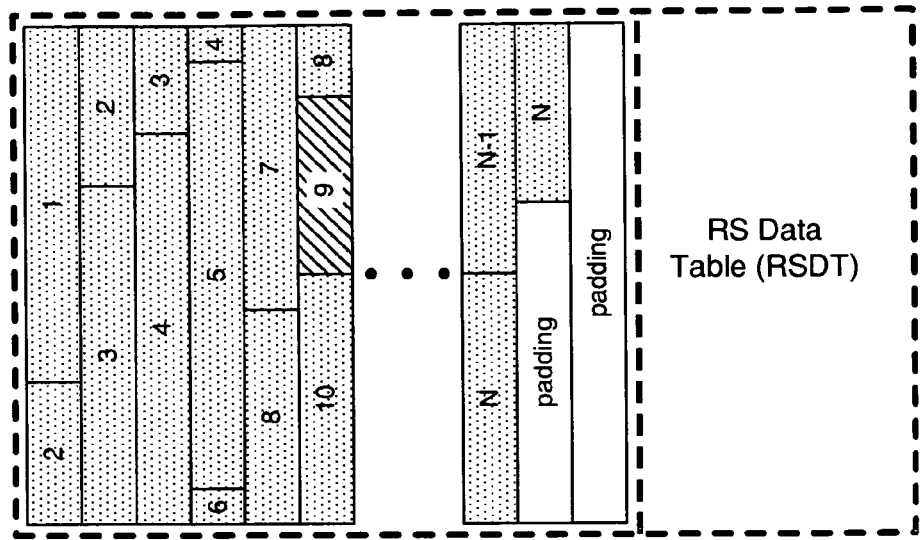
Figure 1E:
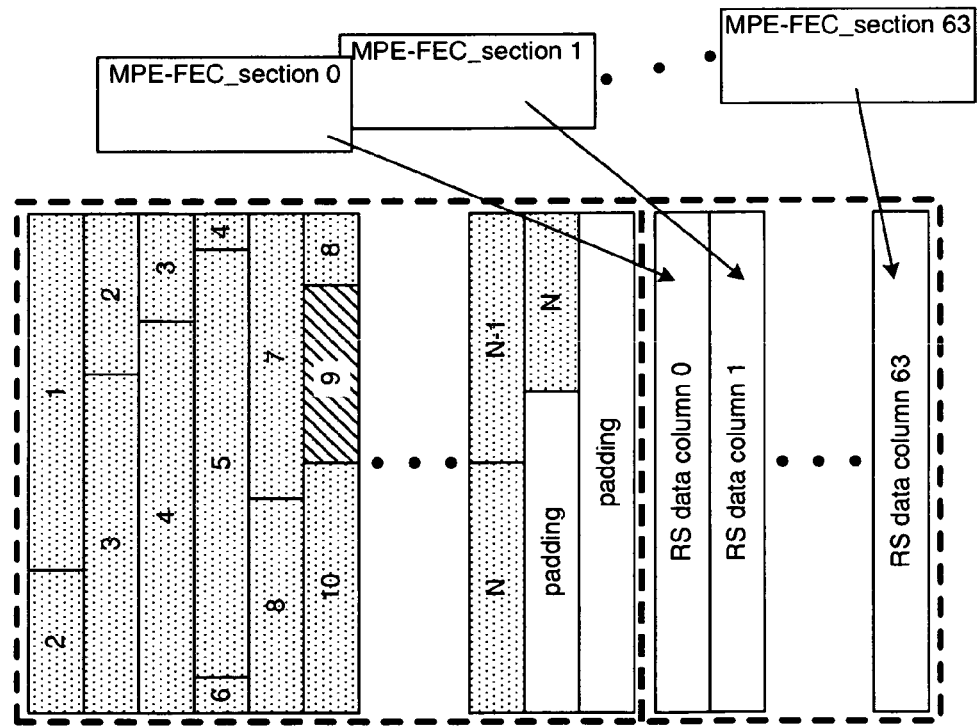
Figure 1F:
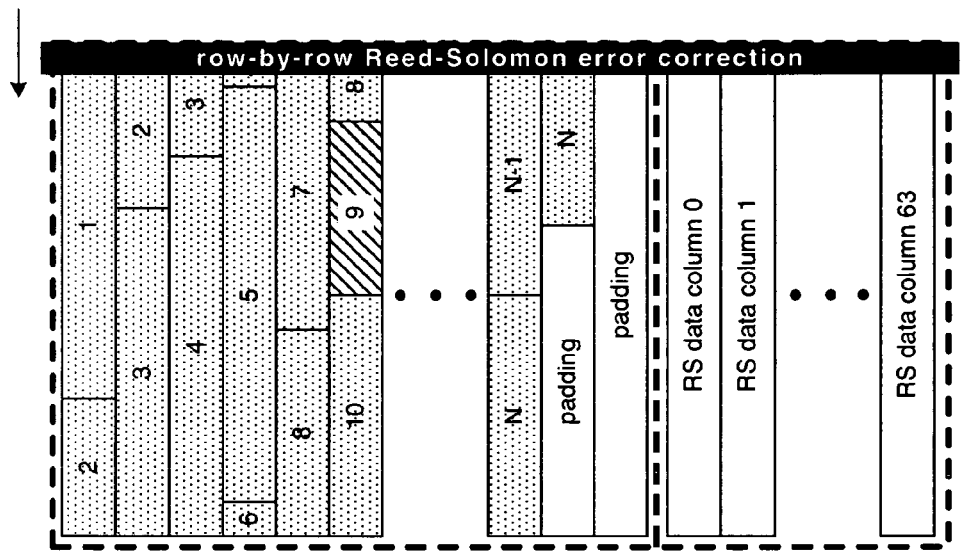
Figure 1G:
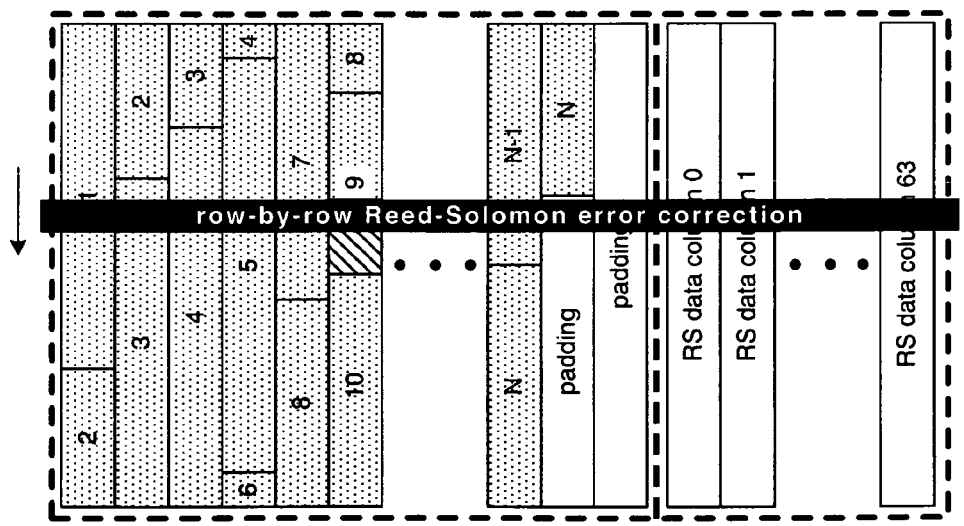
Figure 1H:
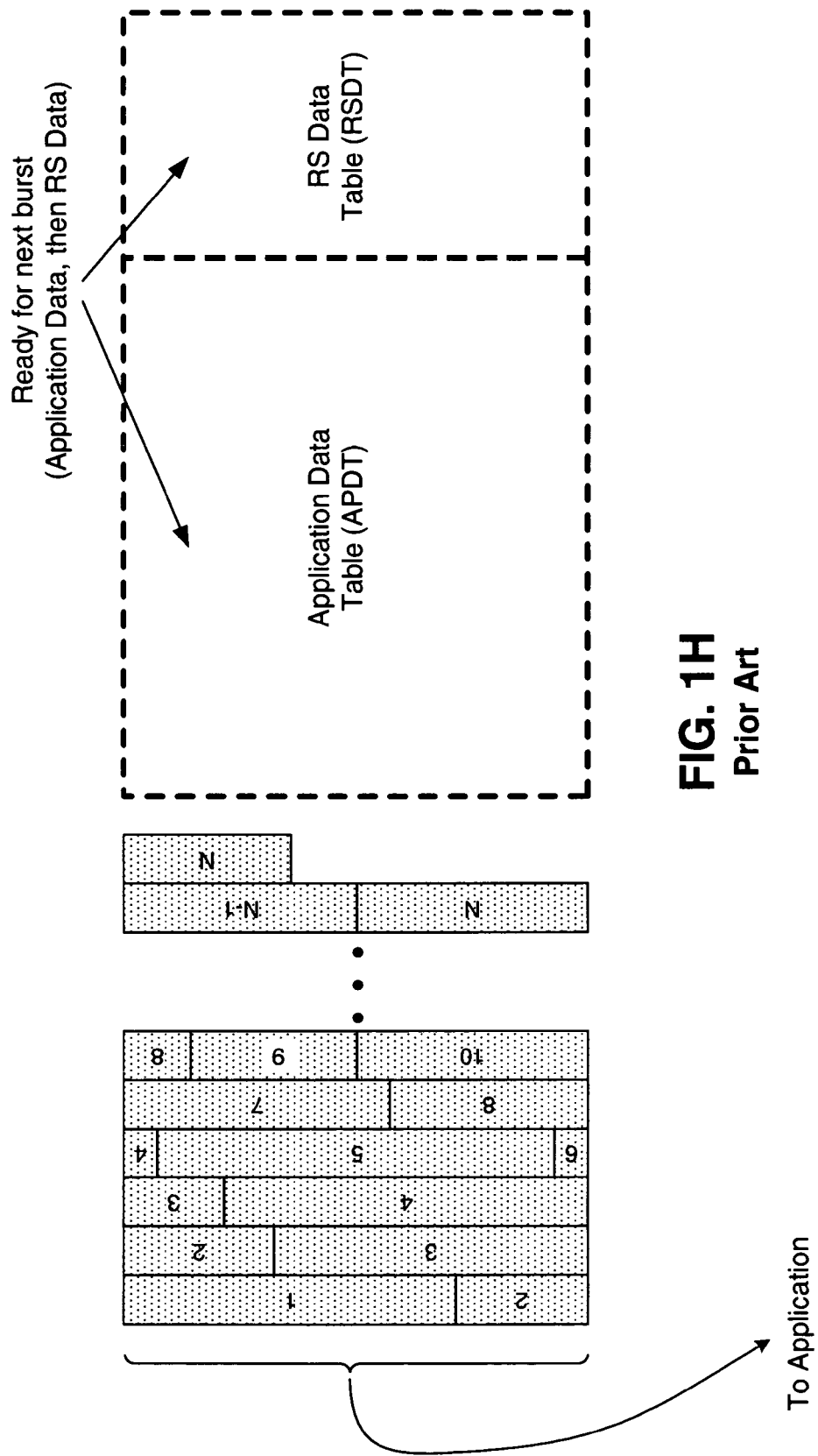
Figure 2:
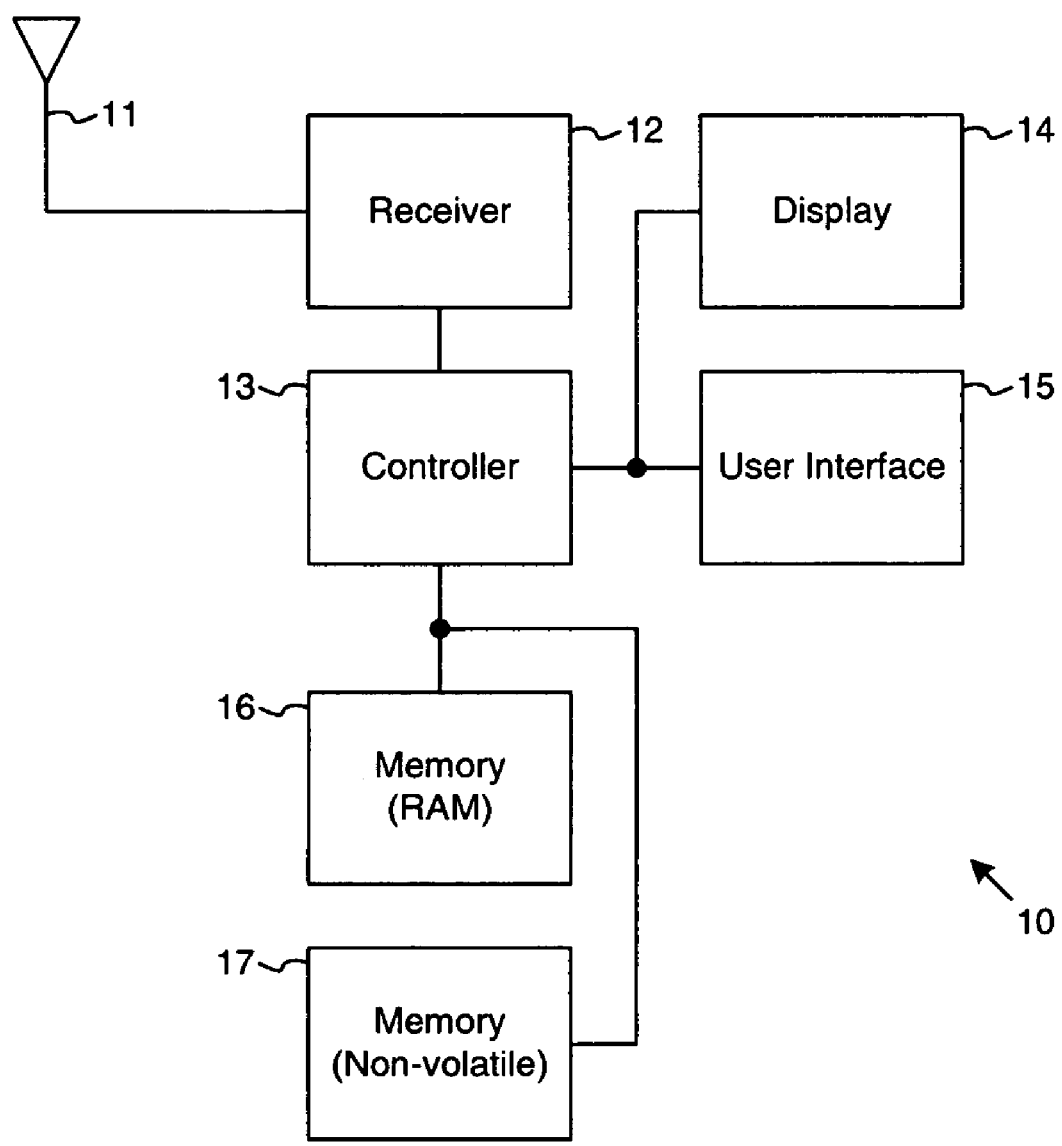
FIG. 2 is a block diagram of a mobile terminal according to at least some embodiments of the invention.

FIG. 2 is a block diagram of a mobile terminal 10 according to at least one embodiment of the invention. As used herein, "mobile terminal" includes wireless devices capable of receiving DVB-H communications. A mobile terminal may be a cellular or other wireless telephone having such capability. "Mobile terminal" also encompasses other types of devices providing two-way wireless communication (e.g., a mobile data terminal), as well as receive-only devices. Mobile terminal 10 receives DVB-H bursts via antenna 11. The received bursts are demodulated and processed in receiver 12 to extract digital data (e.g., datagram_sections and MPE-FEC_sections) contained in the bursts. Also contained within receiver 12 are components for timing, synchronization, and other functions associated with reception of a transmission burst and extraction of digital data. Because such components are known to persons skilled in the art, additional description is not included herein.

Digital data extracted from a burst by receiver 12 is provided to controller 13. Controller 13, which may be a microprocessor, executes programming instructions in order to carry out various conventional functions of mobile terminal 10. Those functions (details of which are also known in the art and thus not extensively described herein) include things such as sending and receiving communications from mobile terminal 10, providing video communication and/or other application data output to a user via display 14, receiving and acting on input received from a user, etc. Controller 13 receives user input from user interface 15, which may include a keypad, a microphone, a camera, etc. User interface 15 may also include a graphical user interface by which a user selects one or more elements on display 14. Controller 13 is also communicatively coupled to memory 16. Memory 16 is used to store data being processed by controller 13, as well as application software and other programming instructions being executed by controller 13. In some embodiments, memory 16 is a volatile random access memory (RAM) which only retains data while mobile terminal 10 is activated. Mobile terminal 10 further includes a non-volatile memory 17 for longer-term data storage.

In addition to providing various conventional functions, controller 13 is further configured to process MPE-FEC frames. In particular, controller 13 executes instructions so as to control buffering and processing of MPE-FEC frame data as described herein. FIGS. 3-10 are block diagrams of mobile terminal 10 showing buffering and processing of MPE-FEC frame data according to at least some such embodiments. For convenience, display 14, user interface 15 and non-volatile memory 17 are omitted from FIGS. 3-10. Similarly, the block corresponding to memory 16 is enlarged to allow easier depiction of various items stored in memory 16. One such item is an arbitrary application program 70. Controller 13 is simultaneously executing application 70 (e.g., on another programming thread) while controller 13 stores and processes MPE-FEC data from time-sliced data transmission bursts. Also shown in memory 16 are regions set aside as APDT buffer 52, RSDT buffer 54, supplemental buffer 56, mapping table 58, and error table 60. The use of these regions is described below in connection with various figures of FIGS. 3-9.

Figure 3:
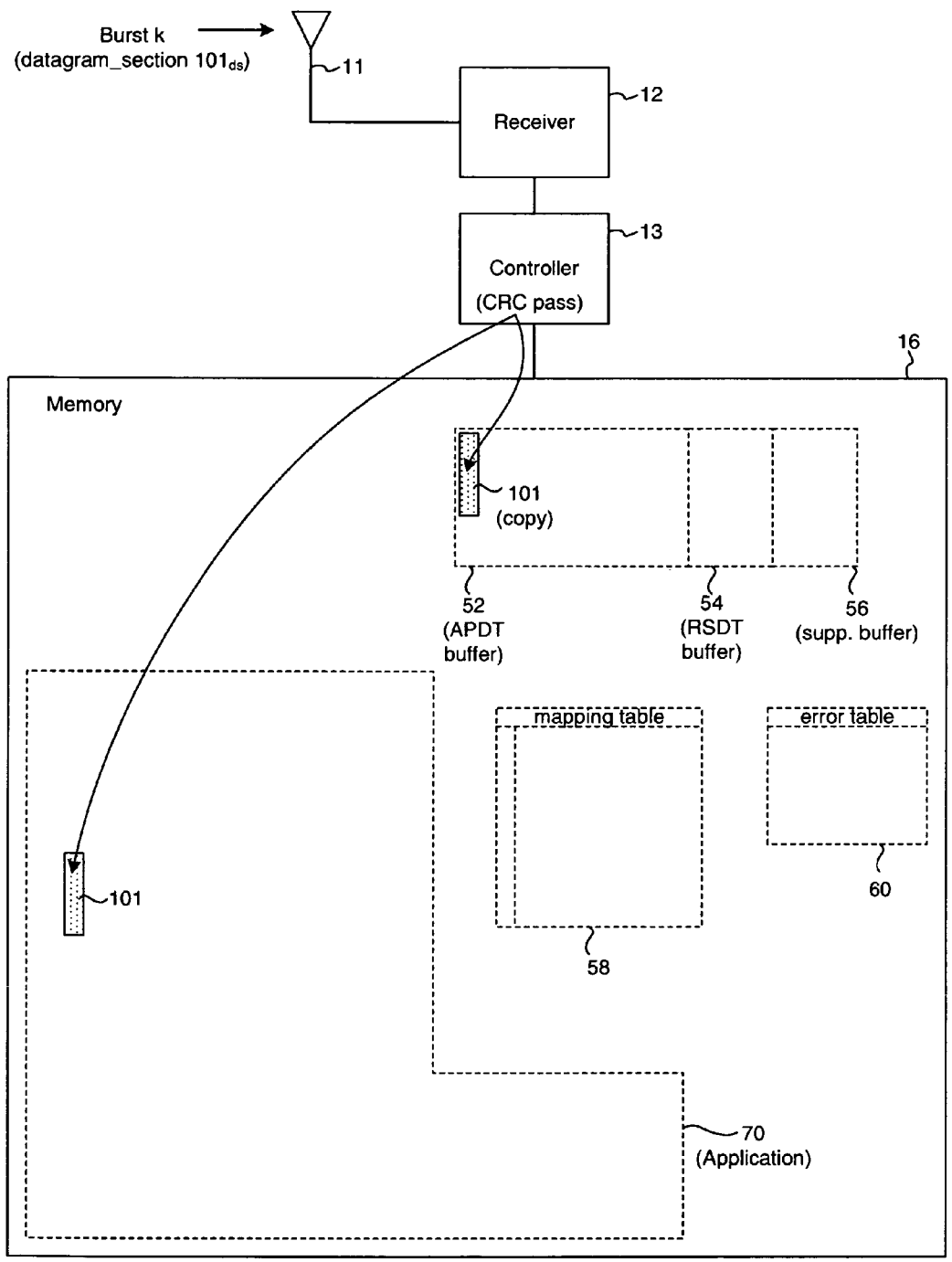
FIGS. 3-10 are block diagrams showing buffering and processing of MPE-FEC frame data according to at least some embodiments of the invention.

Beginning in FIG. 3, burst k is received via antenna 11. Receiver 12 extracts datagram_section $101_{ds}$ from burst k and provides same to controller 13. Controller 13 performs a CRC check to determine if the application data in datagram_section $101_{ds}$ contains transmission errors. Upon determining that the application data is error-free, controller 13 immediately forwards a first data block 101 (containing the application data bytes from the datagram_section $101_{ds}$) to application program 70. Controller 13 also places a copy of data block 101 in APDT buffer 52. Although the data in block 101 is error-free, error-free data in one cell of an APDT row is needed during RS error correction of corrupt data in other cells of the same row. Thus, the error-free data in each row of block 101 may be needed to correct errors elsewhere once the APDT buffer is filled.

Figure 4:
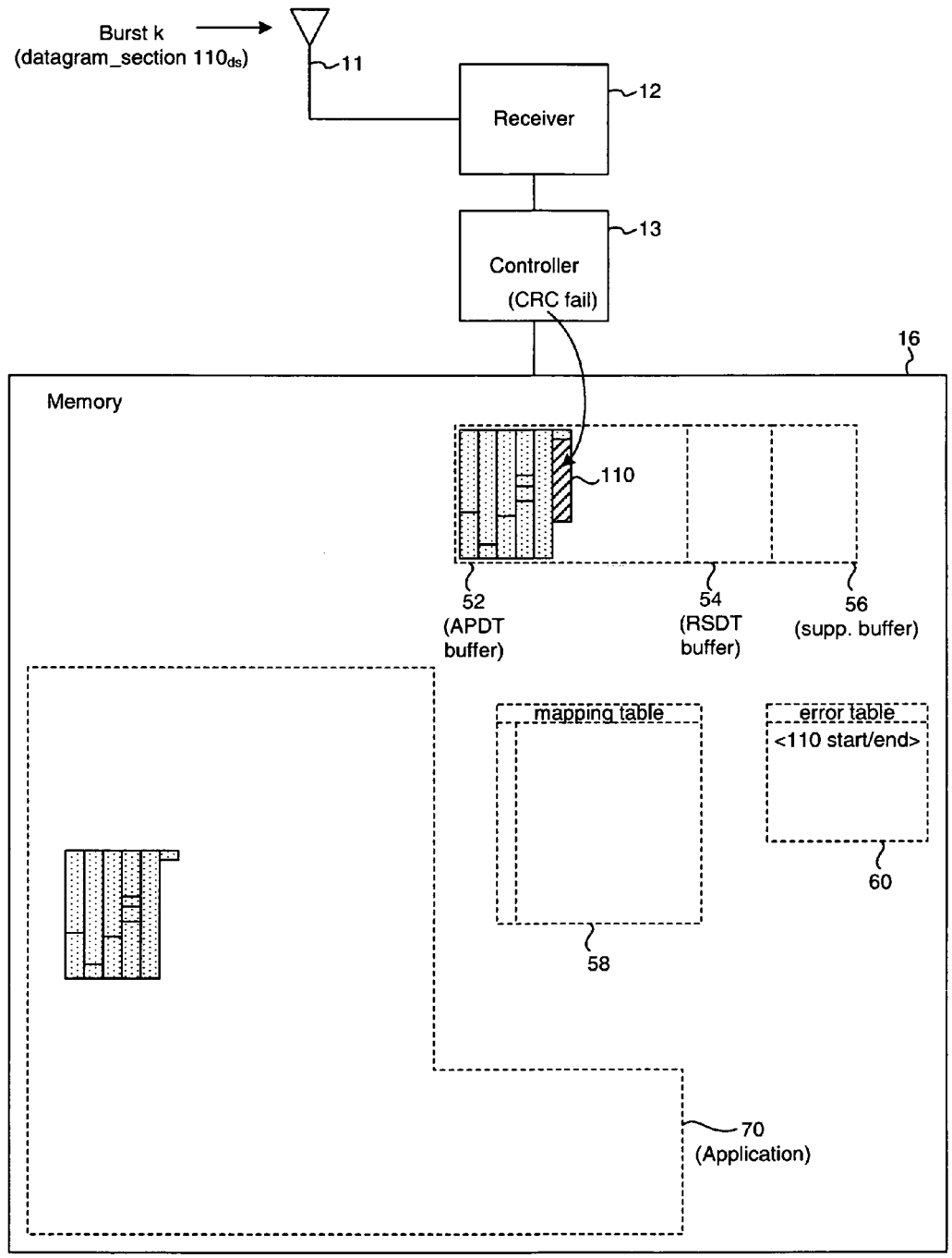

Mobile terminal 10 continues to receive datagram_sections of burst k. FIG. 4 shows mobile terminal 10 at a later time during burst k. In the time since receipt of datagram_section $101_{ds}$ (FIG. 3), mobile terminal 10 has received additional datagram_sections without transmission errors, and has forwarded blocks of application data bytes from those datagram_sections to application 70. As with data block 101, controller 13 has also placed copies of those application data byte blocks in APDT buffer 52. In FIG. 4, datagram_section $110_{ds}$ is received. Unlike previous application data in burst k, the application data bytes in datagram_section $110_{ds}$ fail the CRC check. Because the data is corrupt, controller 13 does not forward that data to application 70. However, controller 13 places a block 110 of the corrupt application data bytes from datagram_section $110_{ds}$ in APDT buffer 52 for later error correction. Controller 13 also stores the starting and ending APDT addresses for block 110 in error table 60.

Figure 5:
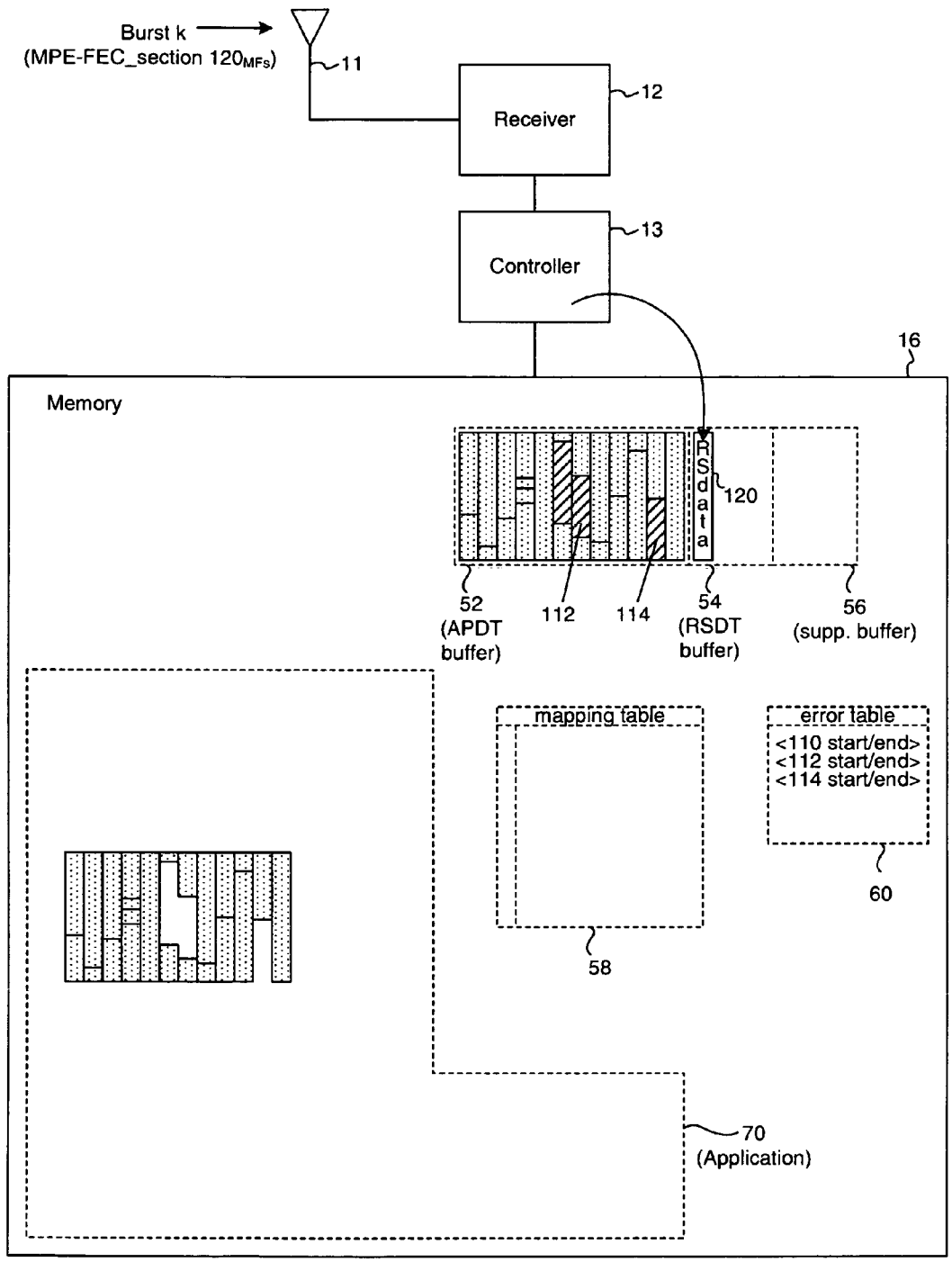

Additional datagram_sections of burst k are then received. FIG. 5 shows mobile terminal 10 at a later time during burst k. In the time since receipt of datagram_section $110_{ds}$ (FIG. 4), mobile terminal 10 has received additional datagram_sections with transmission errors and additional datagram_sections without transmission errors. As to the datagram_sections without errors, controller 13 has forwarded blocks of non-corrupt application data bytes to application 70 and placed copies in APDT buffer 52. Blocks 112 and 114 of corrupted application data bytes have been placed in APDT buffer 52 for later error correction, but copies of those corrupt data blocks have not been provided to application 70. The starting and ending APDT buffer addresses for blocks 112 and 114 have also been added to error table 60. As also shown in FIG. 5, the first MPE-FEC_section (MPE-FEC_section $120_{MFs}$) of burst k is received. Controller 13 stores, in RSDT buffer 54, RS data block 120 containing the RS data bytes of MPE-FEC_section $120_{MFs}$.

Figure 6:
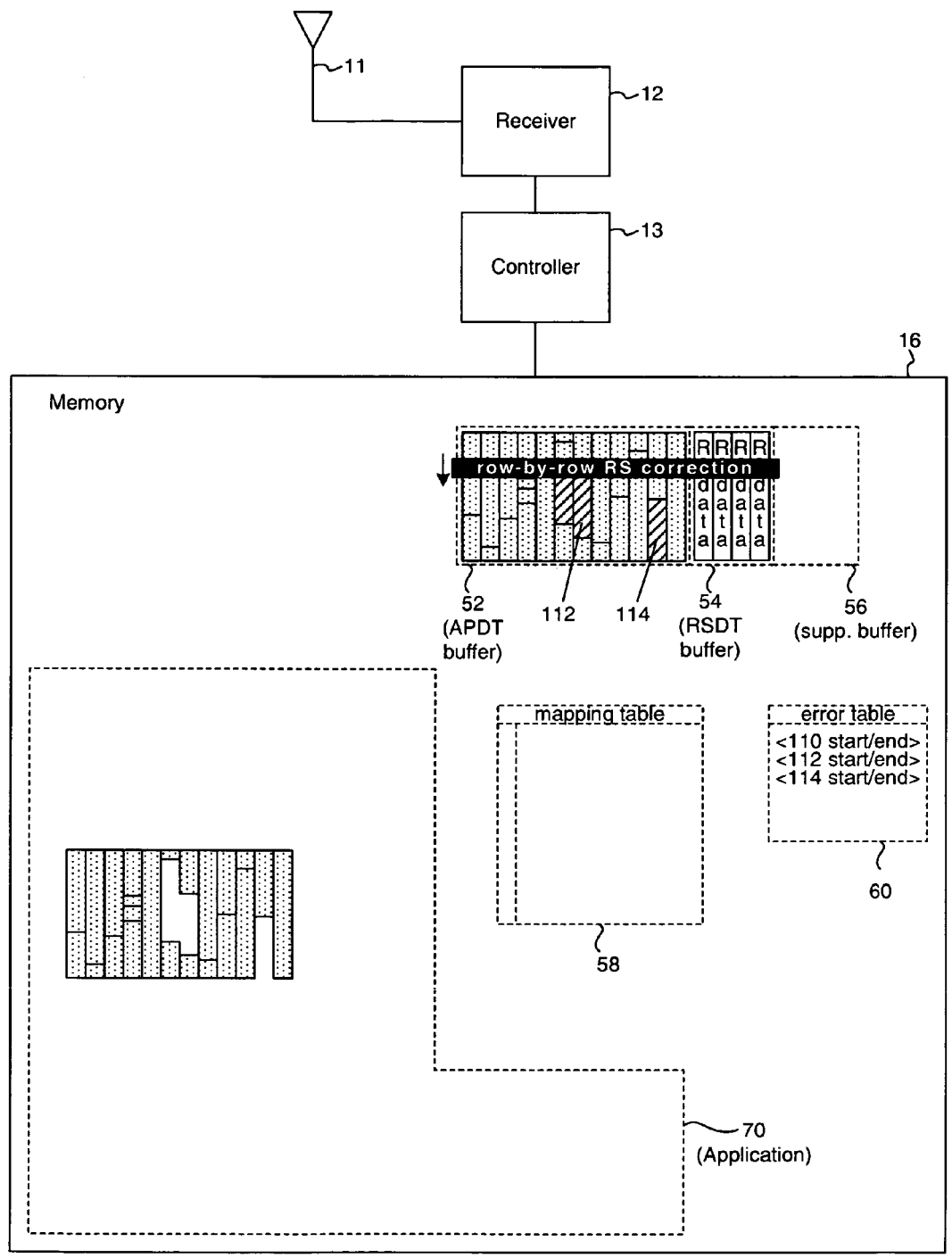
Figure 7:
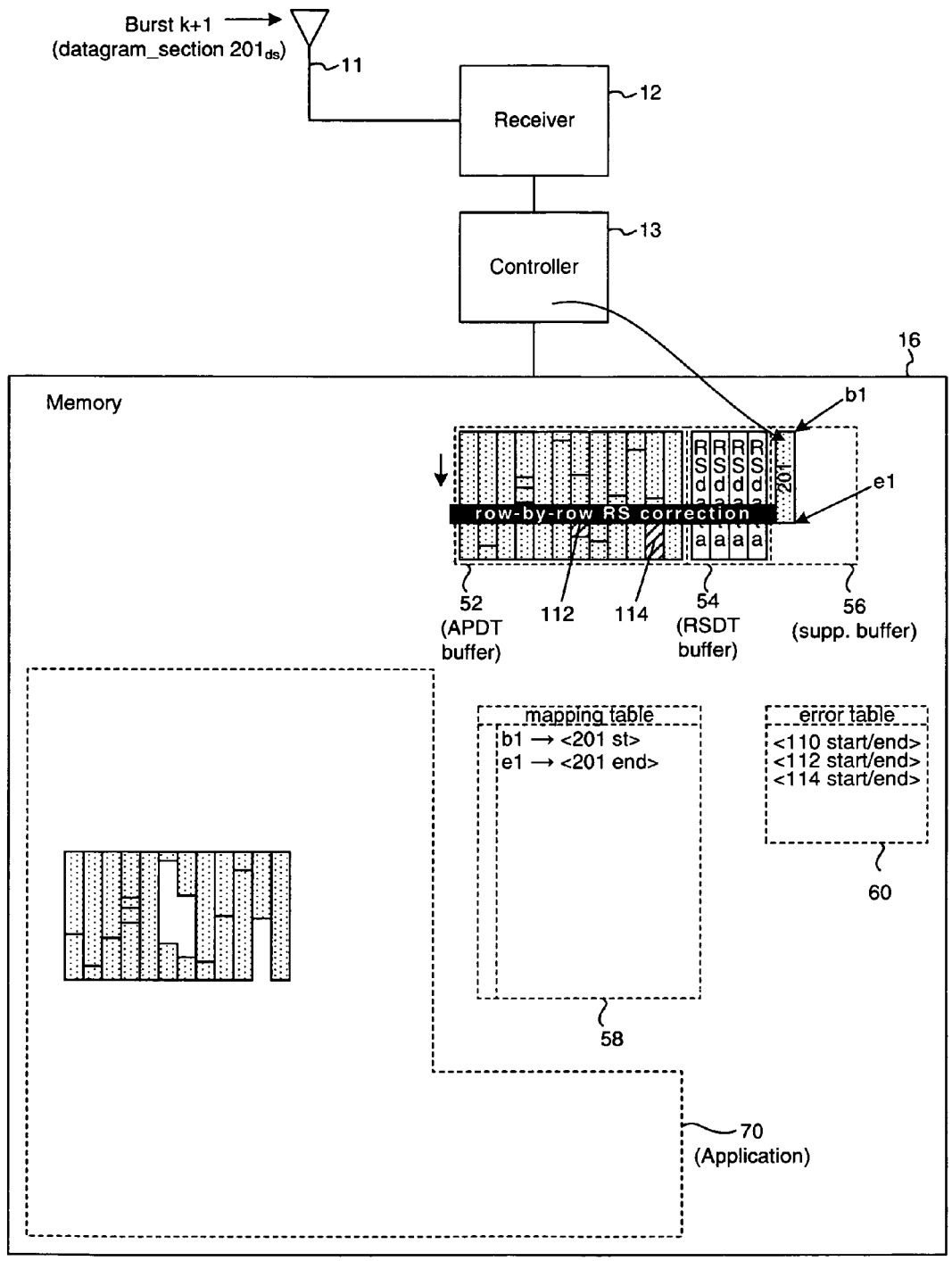

FIG. 6 shows mobile terminal 10 after burst k has ended. RSDT buffer 54 has been filled with additional RS data blocks from other MPE-FEC_sections of burst k, and row-by-row RS correction of data in APDT buffer 52 has begun. In FIG. 7, RS correction of application data in APDT buffer 52 is continuing. However, the next time-slicing transmission data burst (burst k+1) has begun before RS correction of application data from burst k has been completed. Receiver 12 extracts datagram_section $201_{ds}$ from burst k+1 and forwards same to controller 13. Because application data from datagram_section $201_{ds}$ cannot be placed in APDT buffer 52 without potentially disturbing the ongoing RS correction of data from burst k, controller 13 places a block 201 of application data bytes from datagram_section $201_{ds}$ in supplemental buffer 56. Prior to placing block 201 in supplemental buffer 56, controller 13 performs a CRC check on the application data in datagram_section $201_{ds}$. Although the data in block 201 is error-free, controller 13 does not (in at least some embodiments) immediately forward that data to application 70. So that controller 13 can later transfer block 201 to its proper location in APDT buffer 52, the beginning (b1) and ending (e1) byte addresses of block 201 in supplemental buffer 56 are stored in mapping table 58 with the corresponding APDT buffer starting and ending addresses. Specifically, controller 13 determines (from address data in datagram_section $201_{ds}$) that the data of block 201 is intended for placement in the row 0/column 0 APDT cell (having APDT buffer address "<201 st>") and continuing through a specific APDT ending address <201 end>. Controller 13 therefore maps the starting and ending addresses of block 201 in supplemental buffer 56 (b1, e1) to the starting and ending addresses for block 201 in APDT buffer 52 (<201 st>, <201 end>).

Figure 8:
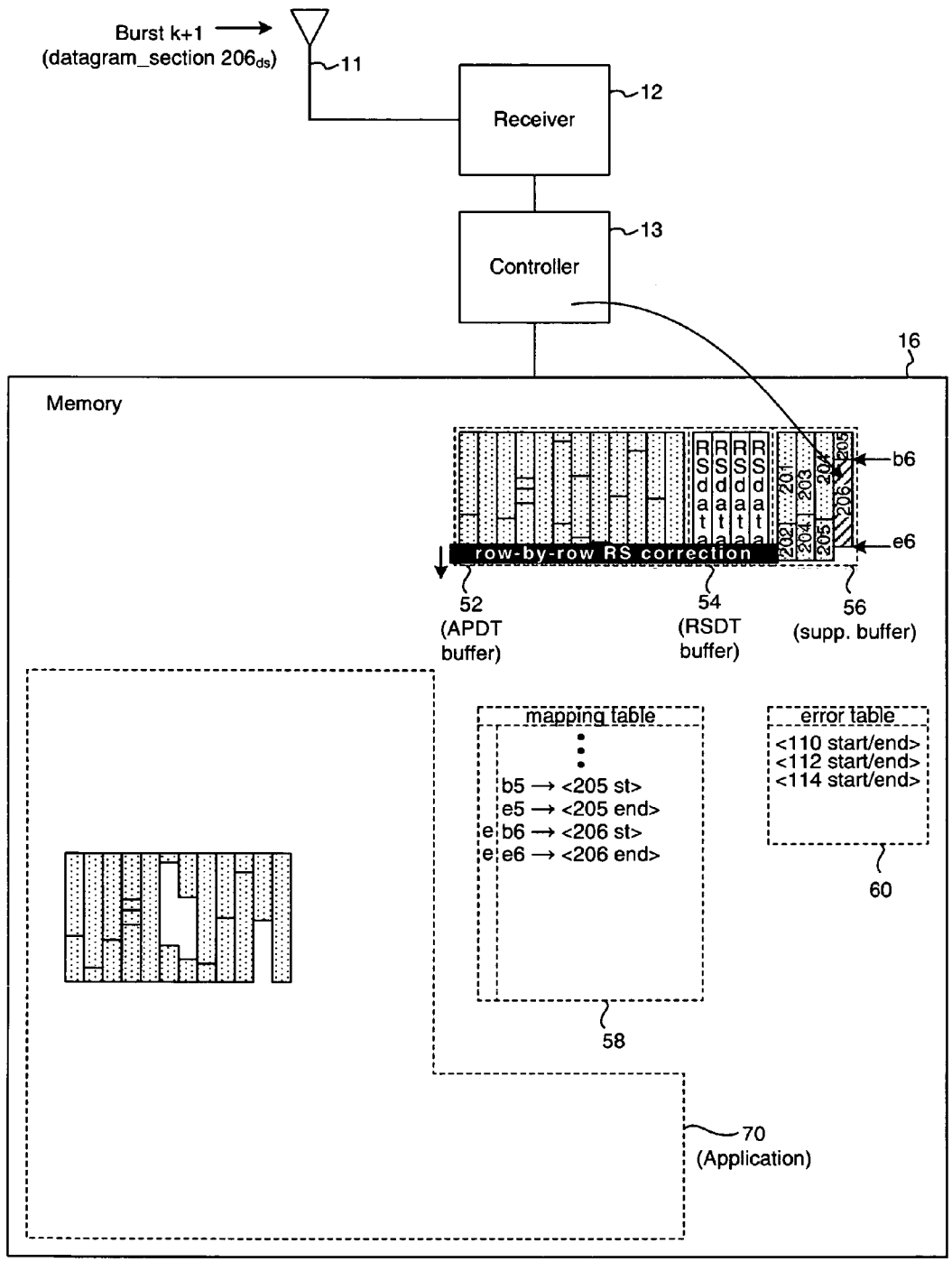

As shown in FIG. 8, mobile terminal 10 continues to receive burst k+1 and to perform RS correction of burst k data. Blocks 202 through 205 of burst k+1 application data have been placed in supplemental buffer 56. Although not shown in FIG. 8, controller 13 has also stored data in table 58 mapping the starting and ending addresses of these blocks in supplemental buffer 56 to the starting and ending addresses for these blocks in APDT buffer 52. As also shown in FIG. 8, newly-received datagram_section $206_{ds}$ fails a CRC check. Controller 13 stores block 206 containing the corrupted application data bytes of datagram_section $206_{ds}$ in supplemental buffer 56, and includes starting/ending byte mapping data in table 58. In addition, controller 13 also includes flags ("e") in table 58 to indicate that the block 206 data is corrupt.

Figure 9:
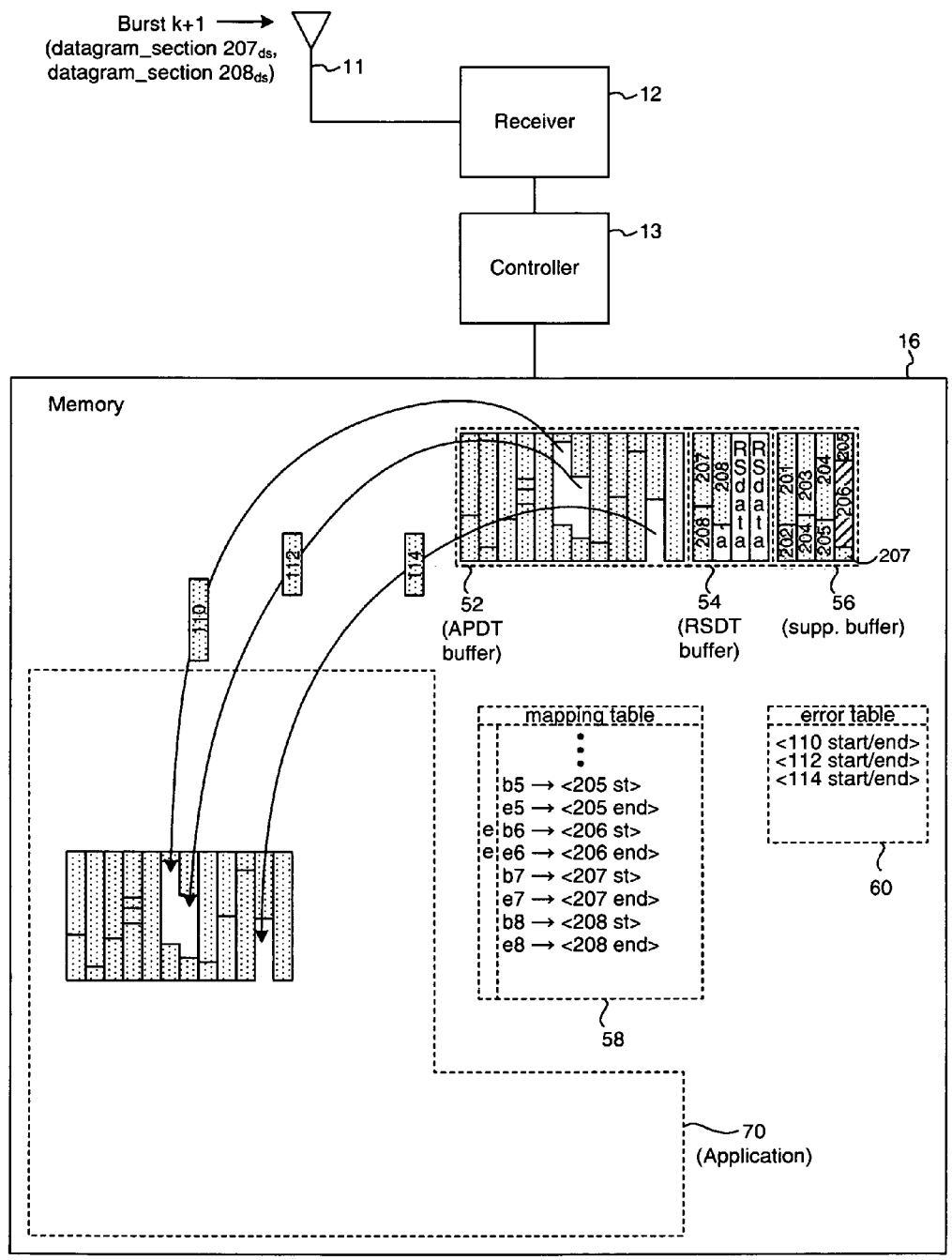

FIG. 9 shows mobile terminal 10 just after RS correction of burst 1 data has been completed, and while burst k+1 is still being received. Controller 13 transfers the corrected burst 1 data (blocks 110, 112 and 114) to application 70. Because the burst k data received without errors was previously transferred to application 70, controller 13 uses the data in error table 60 to determine which of the burst k bytes in APDT buffer 52 should be transferred. While blocks 110, 112 and 114 are being transferred to application 70, the received data from burst k+1 begins to exceed the capacity of supplemental buffer 56. Accordingly, controller 13 begins placing data from burst k+1 in RSDT buffer 54. After the RS correction of burst k data is complete, the burst k RS data is no longer needed. Accordingly, and until it is needed for RS data from burst k+1, RSDT buffer 54 is available for interim storage of burst k+1 application data.

Figure 10:
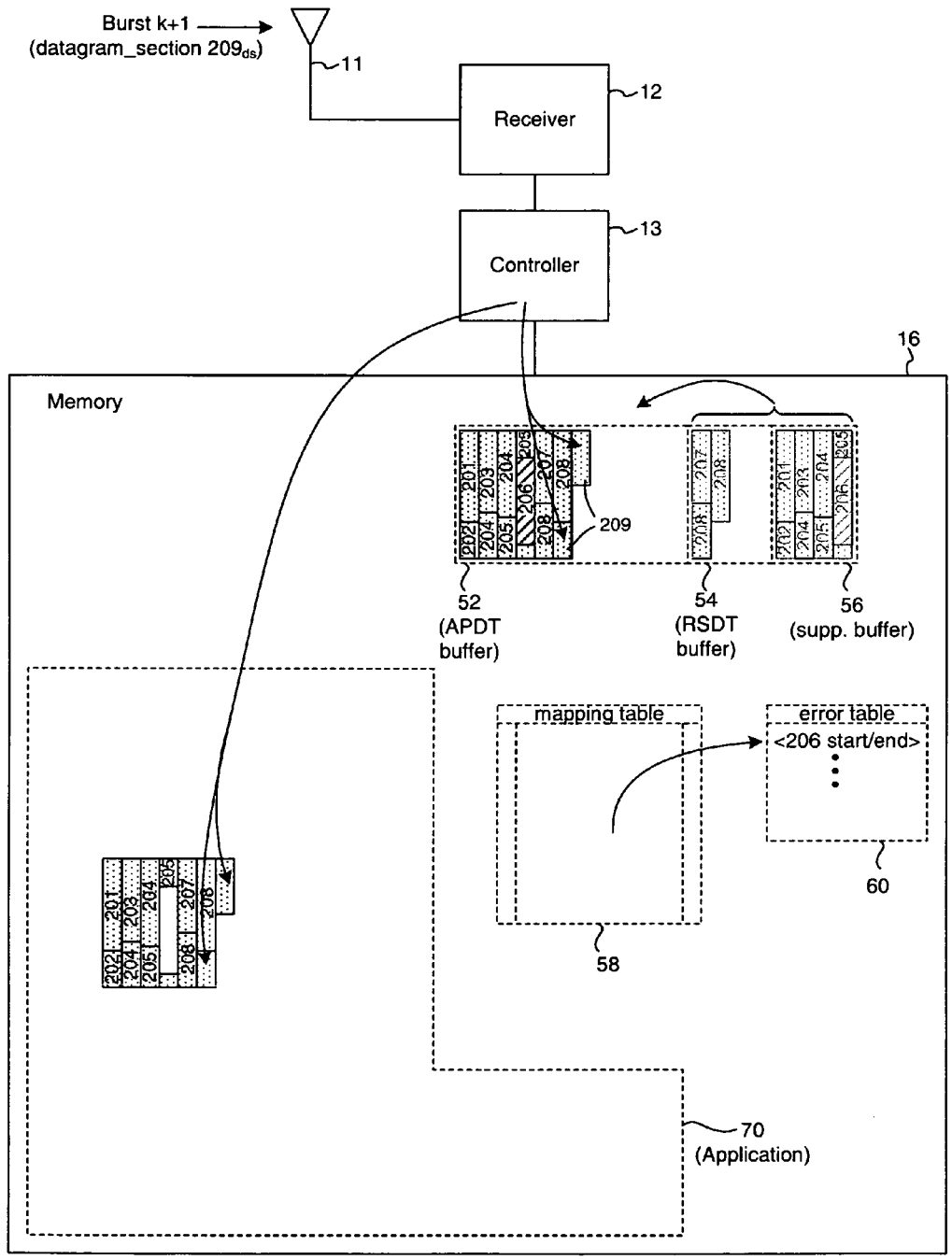

In FIG. 10, controller 13 then transfers burst k+1 data (blocks 201-208) from supplemental buffer 56 and RSDT buffer 54 to APDT buffer 52 using the information in mapping table 58. Blocks 201-205 and 207-208 of burst k+1 application data that were received without error (i.e., which are not flagged as corrupt in mapping table 58) are also transferred to application 70. Blocks flagged as corrupt in mapping table 58 are noted in error table 60. Any remaining application or RS data received during burst k+1 is then placed directly in the appropriate location in APDT buffer 52 or RSDT buffer 54, as shown for block 209. When all burst k+1 data has been received, error correction for burst k+1 data begins (not shown). If burst k+2 begins to arrive before completion of error correction of burst k+1 data, the burst k+2 data is temporarily stored in supplemental buffer 56 and (if necessary) RSDT buffer 54 in the same manner as has been described for blocks 201-208.

As can be appreciated from FIGS. 3-10 and the preceding description, the embodiment of FIGS. 3-10 allows mobile terminal 10 to buffer data from an incoming burst using less memory space than would be needed using conventional methods. In such conventional methods, memory space would be reserved for at least one complete MPE-FEC frame in addition to the frame currently being processed. By comparison, various embodiments of the invention use a much smaller supplemental buffer. If the supplemental buffer is insufficient, the RSDT buffer memory space can be used for additional buffering between conclusion of one RS correction and receipt of RS data in the next incoming burst. Some data copying is performed in addition to what might be needed in conventional methods. However, this does not present a problem in most cases, as the internal data interface (i.e., for transferring data within memory 16) is approximately twice as fast as the air interface over which burst data is received.

The necessary size for supplemental buffer 56 will depend on factors such as input data bandwidth, filtered payload share in the data, output bandwidth and processor speed. In at least some embodiments, supplemental buffer 56 is equal in size to the maximum number of MPE-FEC frame columns which can be RS-corrected (64 columns if erasure decoding is used, 32 columns if non-erasure decoding is used). In other embodiments, supplemental buffer 56 is sized in multiples of 64 columns.

Numerous other variations on the embodiments of FIGS. 3-10 are also within the scope of the invention. For example, corrupt application data need not be copied into APDT buffer 52, supplemental buffer 56 or RSDT buffer 54. Because RS correction ignores an erroneous data value when determining a correct data value, a block corresponding to corrupt data could simply be set to all 0's, or simply left alone (i.e., previous data in the block not overwritten). As another example, some of the data stored in APDT buffer 52 may be padding, and some of the columns in RSDT buffer 54 may be punctured. Memory space allotted to padding and/or puncturing could also be used for interim buffering of incoming burst data while data from a preceding burst is being processed. If a mobile terminal supports padding signaling (i.e., the RS correction algorithm is aware of which ADPT cells contain padding without actually receiving data from the padded cells), application data padding need not be stored in supplemental buffer 56, RSDT buffer 54 or APDT buffer 52.

In at least some alternate embodiments, specific regions of memory need not be reserved for either an incoming burst or for a previously-received burst which is still being processed. Instead of placing application and RS data for an MPE-FEC frame into a single contiguous memory region arranged according to the tabular format of EN 301 192, blocks of data are stored in arbitrary memory locations and accessed using a linked list.

Figure 11:
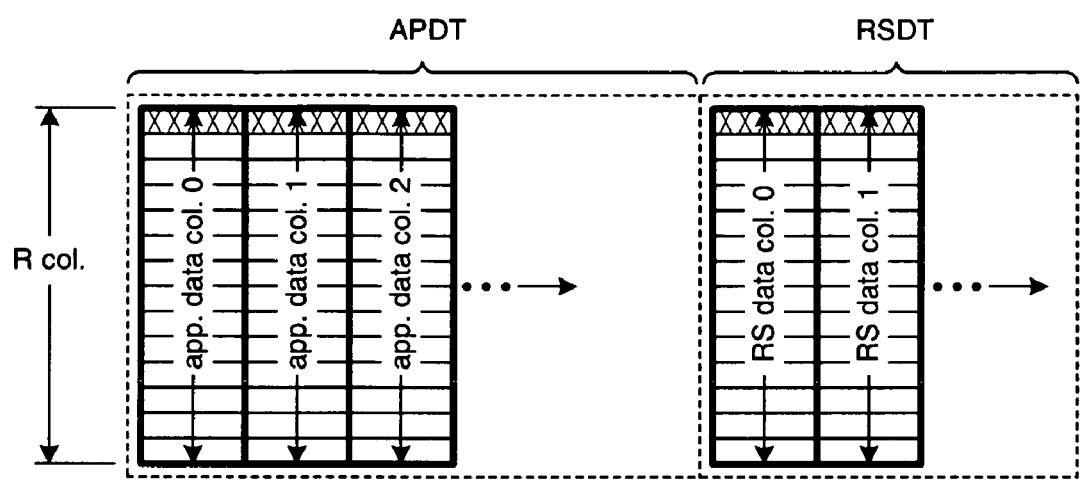
FIG. 11 is a block diagram showing a conventional arrangement of MPE-FEC frame data.
Figure 12:
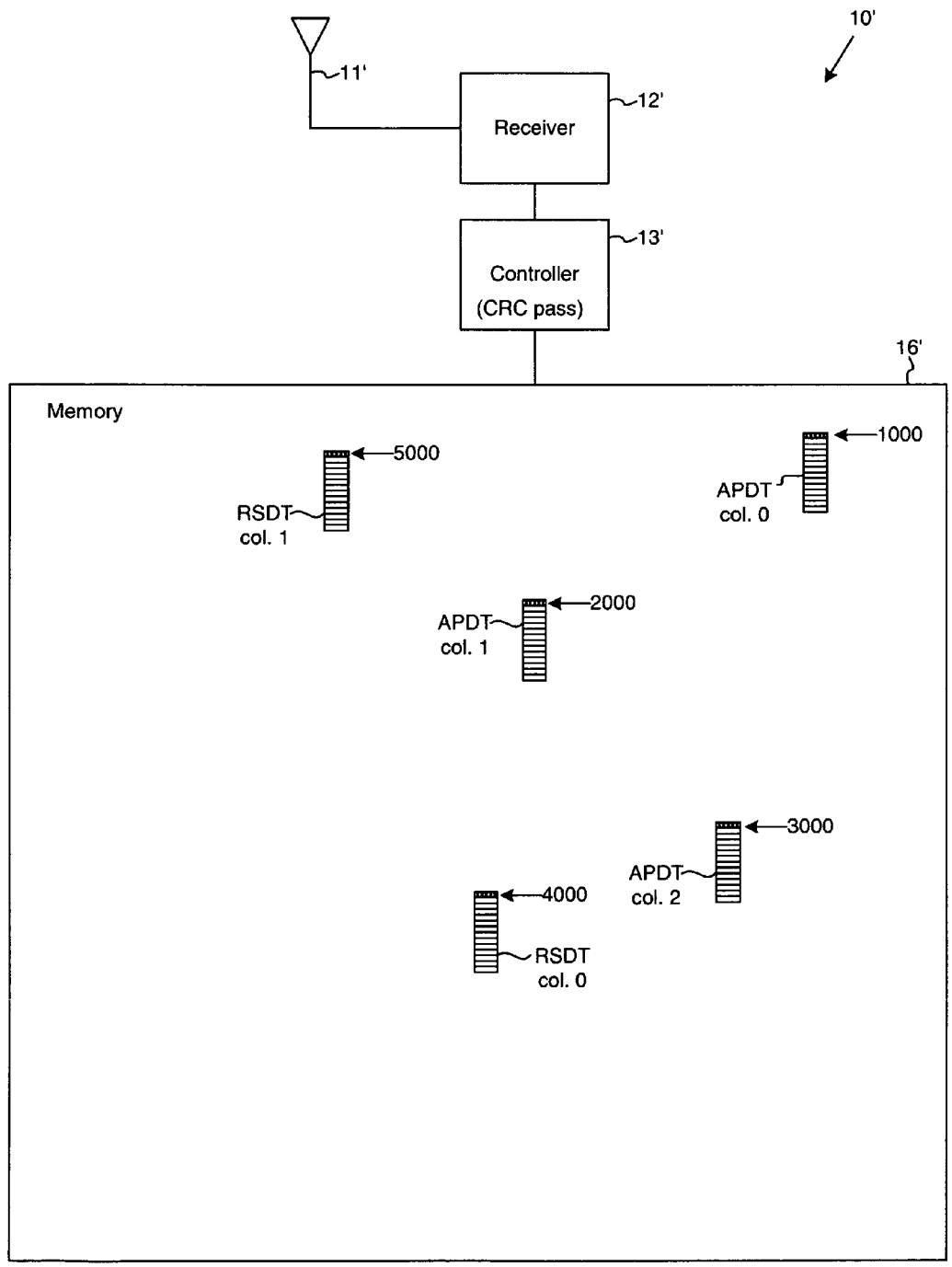
FIGS. 12-15 are block diagrams showing buffering and processing of MPE-FEC frame data according to at least some additional embodiments of the invention.
Figure 13:
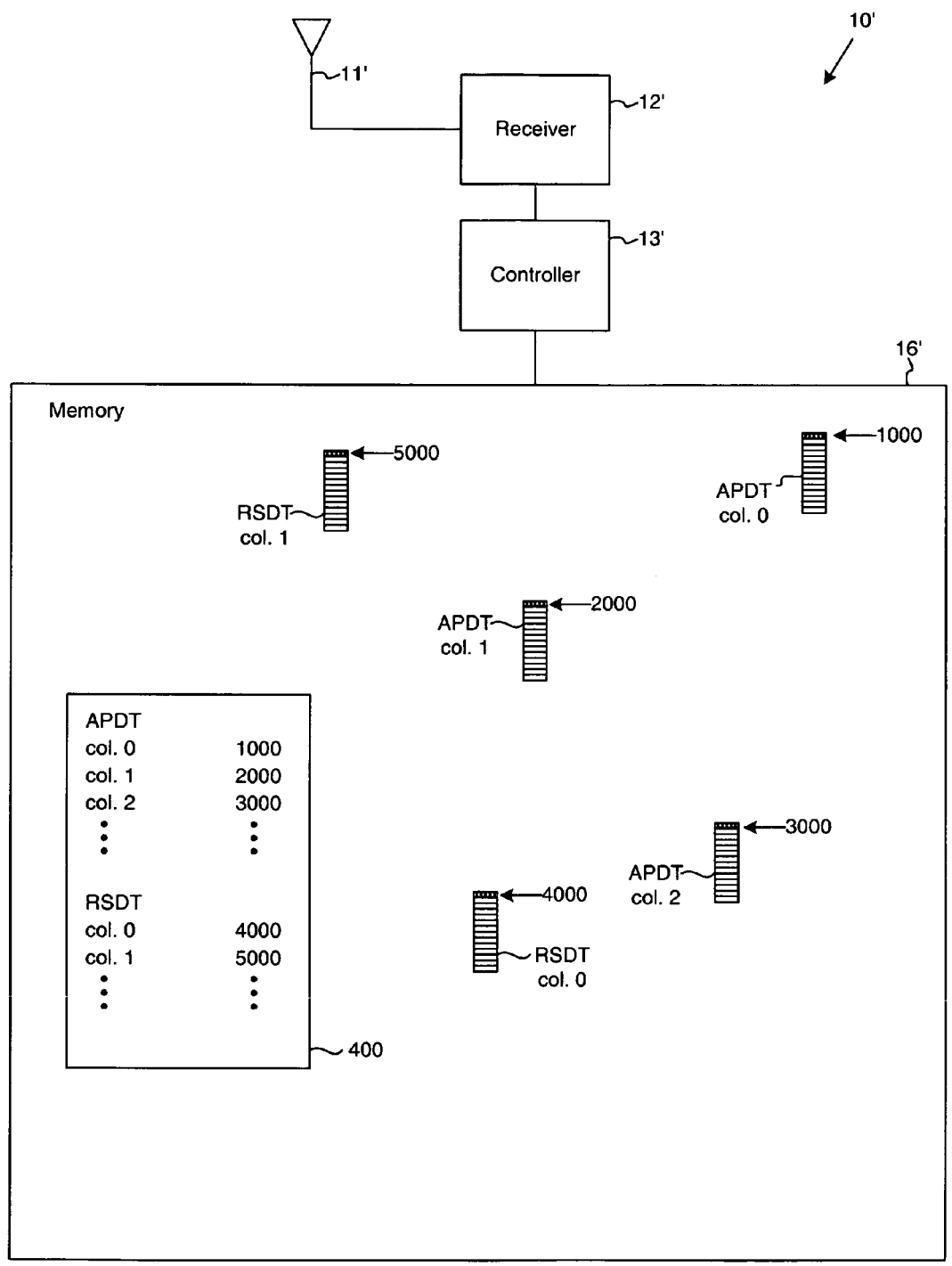

One implementation of such embodiments is shown in FIGS. 12-13. For purposes of explaining differences between this implementation and conventional approaches, FIG. 11 shows a simplified example of a collection of application and RS data blocks organized in a conventional MPE-FEC frame having R columns (where R is an arbitrary number less than or equal to 1,024). For simplicity, only three columns of application data and two columns of RS data are shown. When the data of FIG. 11 is processed, the RS data bytes in the first row of the RS data table (shown in cross-hatching) are used to correct errors in the first row of the application data table (also shown with cross-hatching). A similar pattern then follows for each successive row.

FIG. 12 shows the data in FIG. 11 arranged according to at least certain embodiments of the invention. Also shown in FIG. 12 are antenna 11', receiver 12', controller 13' and memory 16' of a mobile terminal. Antenna 11', receiver 12', controller 13' and memory 16' are substantially similar to antenna 11, receiver 12, controller 13 and memory 16 of FIGS. 2-10, but are configured to operate in a slightly different manner (as described below). Instead of storing all of the MPE-FEC frame data in a single contiguous memory space (as shown in FIGS. 3-10), controller 13' stores columns of the table in FIG. 11 in arbitrarily-located regions of memory 16'. For example, the bytes of application data that would normally occupy column 0 of the APDT are located in a region of memory starting at memory address 1000. The bytes of application data that would normally occupy column 1 of the APDT are located in another region of memory starting at memory address 2000; the region holding the column 1 data need not be contiguous to the region holding the column 0 data. A similar pattern follows for the remainder of the APDT and RSDT columns. Moreover, regions of memory 16' need not always store the same type of data. For example, the block beginning at address 4000 is storing data bytes for RSDT column 0 in FIGS. 12-14. At some later time (e.g., after the RSDT col. 0 data for the current burst is no longer needed), that same block (or a portion of that block) might be used for subsequent burst APDT data, or for some other type of data. Indeed, the starting and ending addresses for blocks might also change. By way of illustration, APDT or RSDT data bytes for a subsequent burst might be placed in a block beginning at memory address 4998 or 5003.

Figure 14:
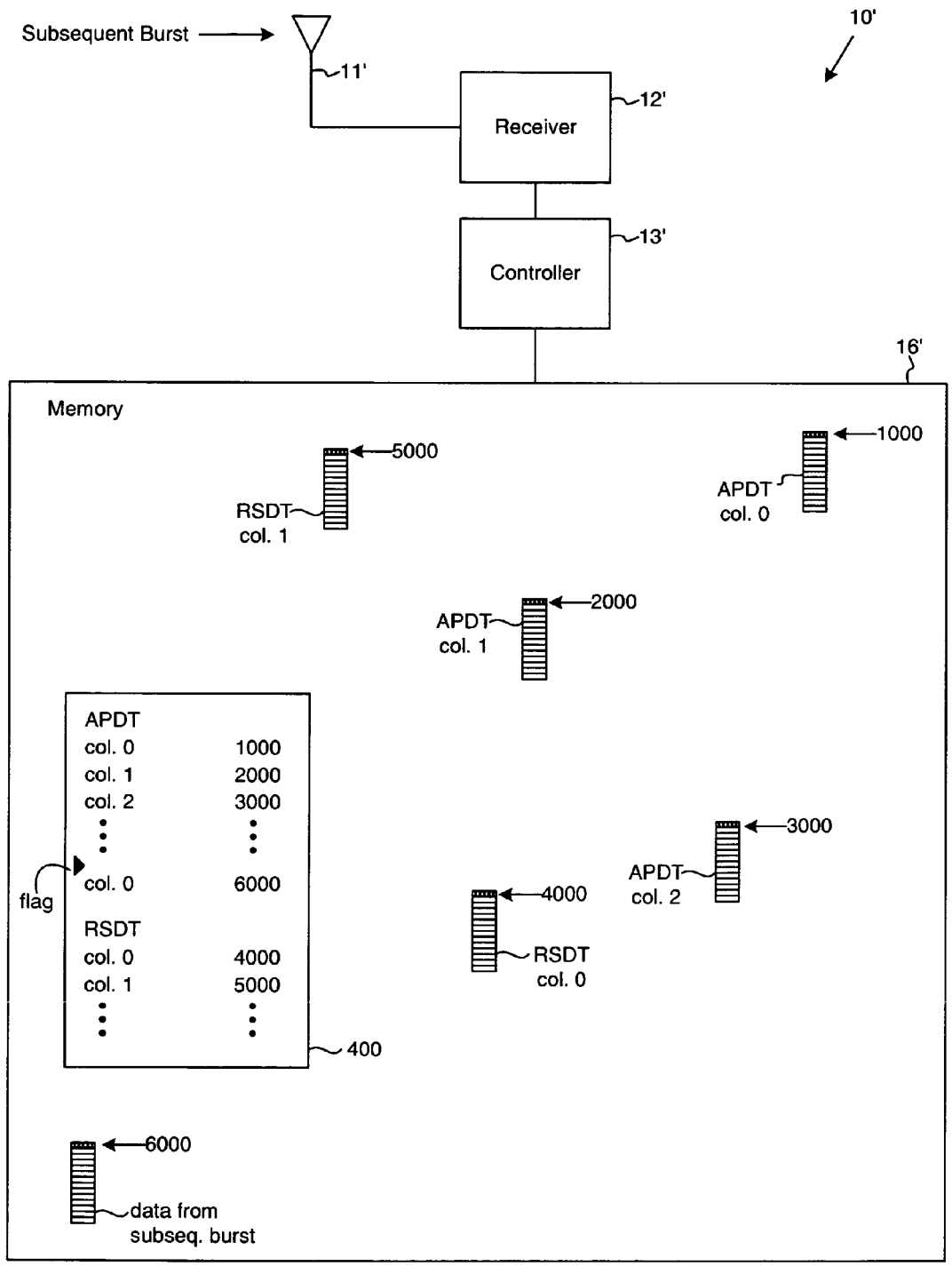

FIG. 13 illustrates RS correction of application data stored as shown in FIG. 12. To correct errors in application data bytes which would conventionally be located in a first application data table row, controller 13' must obtain each of the bytes which are cross-hatched in FIG. 11. Accordingly, controller 13' consults linked list 400 and obtains the byte conventionally placed in the first row of APDT column 0 from memory address 1000. The processor then obtains the byte conventionally placed in the first row of APDT column 1 from memory address 2000. A similar pattern is followed for all of the needed application and RS data bytes of row 0. RS correction is then performed on any of the row 0 APDT bytes which may be corrupt. Controller 13' then increments each of the addresses in linked list 400 by 1 and performs RS correction for row 1. This is then repeated for each of the row calculations. As seen in FIG. 14, subsequent burst data can simply be stored in additional arbitrary memory locations. A flag is placed in table 400 indicating the start of address information for a new burst, and appropriate entries for the next burst's data columns are then included in table 400.

Although not shown in FIGS. 12-14, various aspects of the embodiments of FIGS. 2-10 are also included in connection with at least some variations of the embodiments of FIGS. 12-14. For example, error-free application data can be immediately transferred to an application, with a copy stored in memory 16' (as shown in FIG. 12) for the purpose of error correction. An error list (similar to list 60 of FIGS. 3-10) could also be maintained so that subsequently corrected data can be forwarded to the application. In other embodiments, an application reads data directly from the locations shown in FIG. 12.

As can be appreciated from FIGS. 12-14 and the accompanying description, a mobile terminal operating in accordance with these additional embodiments need not reserve unnecessary space in memory. In particular, memory can be allocated as needed and without setting aside a contiguous region large enough to accommodate either an entire incoming MPE-FEC frame or a preceding MPE-FEC frame which is being processed. Although some amount of memory would be required for list 400, that amount would be relatively small by comparison to the space needed for an entire MPE-FEC frame. Assuming that addresses in memory 16' are 32-bits in length, list 400 would require approximately 8 kbits for a 255 column MPE-FEC frame (255 columns*32 bits).

In the embodiments of FIGS. 12-14, table 400 effectively contains two sub-tables (one for APDT column starting addresses and one for RSDT column starting addresses). In variations of these embodiments, memory table 400 need not be organized in this manner. For example, ASDT and RSDT column addresses could be intermingled. As another example, table 400 could be a dynamic table in which ASDT and RSDT columns are mapped to certain addresses and then remapped to different physical addresses.

Figure 15:
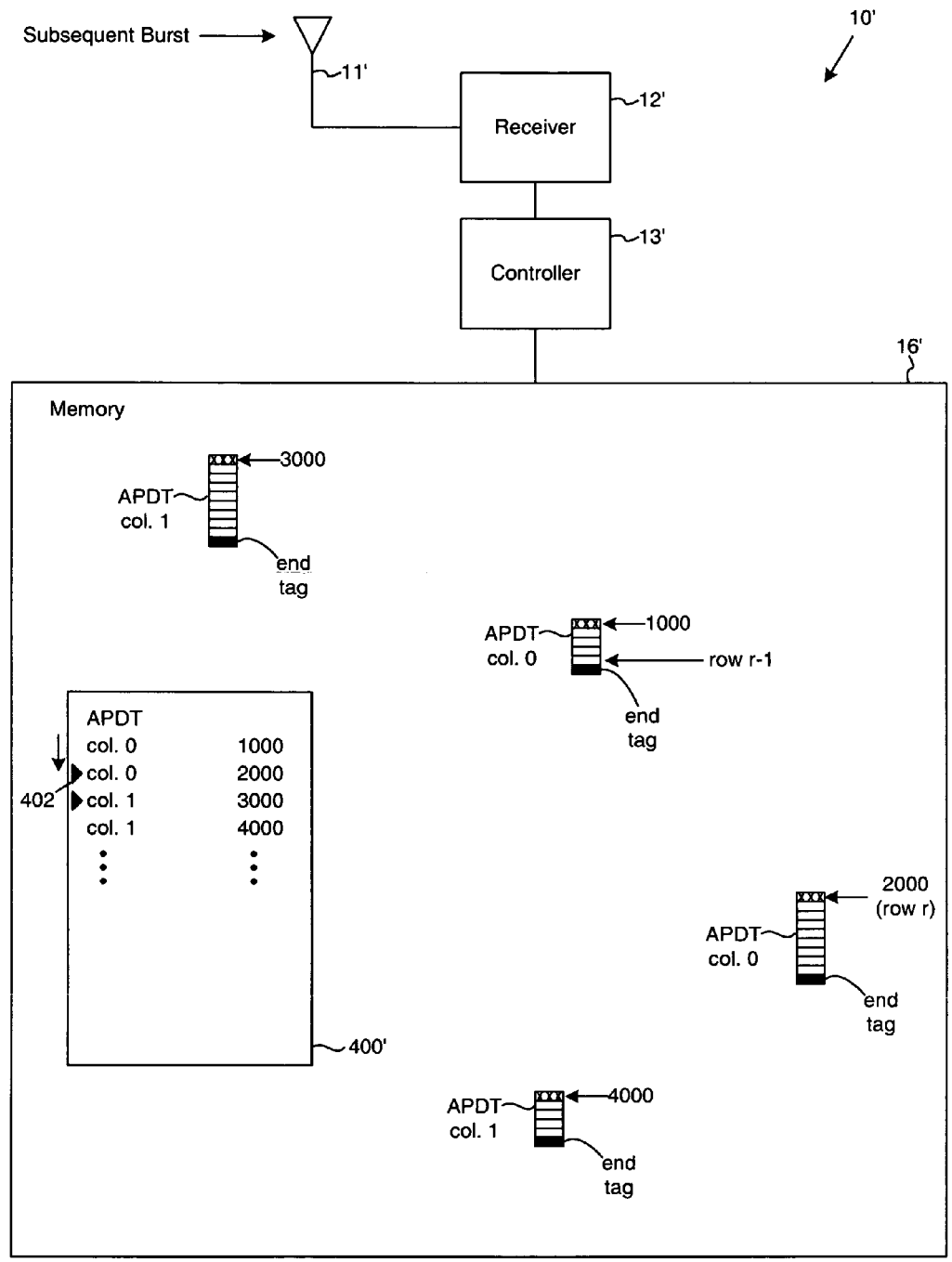

In yet other variations on the embodiments of FIGS. 12-14, MPE-FEC frame data may be stored in memory regions that are smaller than one column. One implementation of this is illustrated in FIG. 15. For simplicity, only APDT col. 0 and col. 1 are shown. APDT cols. 0 and 1 are each separated into two blocks; with the separation point being different for each column. Appended to the end of each block is an "end tag" byte indicating the end of the block. When controller 13' begins RS correction, it places a flag by table 400' entries for the first block of column 0 and for the first block of column 1. When controller 13' performs RS correction for row r-1 of the first col. 0 block, the flag 402 in table 400' is moved to the entry for the second col. 0 block. When controller 13' then performs RS correction for row r, flag 402 indicates where the row r data can be found. A similar procedure is followed when the end of the col. 1 first block (or of another block) is reached.

In some embodiments, a memory management unit (MMU) of controller 13' is configured so that software storing and accessing MPE-FEC frame data effectively "sees" a contiguous memory region. In other words, the MMU acts as an additional layer of software between memory 16' and the software which processes the MPE-FEC data. The MMU provides that software with a block of memory addresses organized as a contiguous MPE-FEC frame. The data is actually stored in arbitrary and non-contiguous memory locations (e.g., as in FIGS. 12-15), with the MMU keeping track of actual memory addresses. The MMU converts between memory addresses used by the MPE-FEC processing software and the actual storage addresses.

Figure 16:
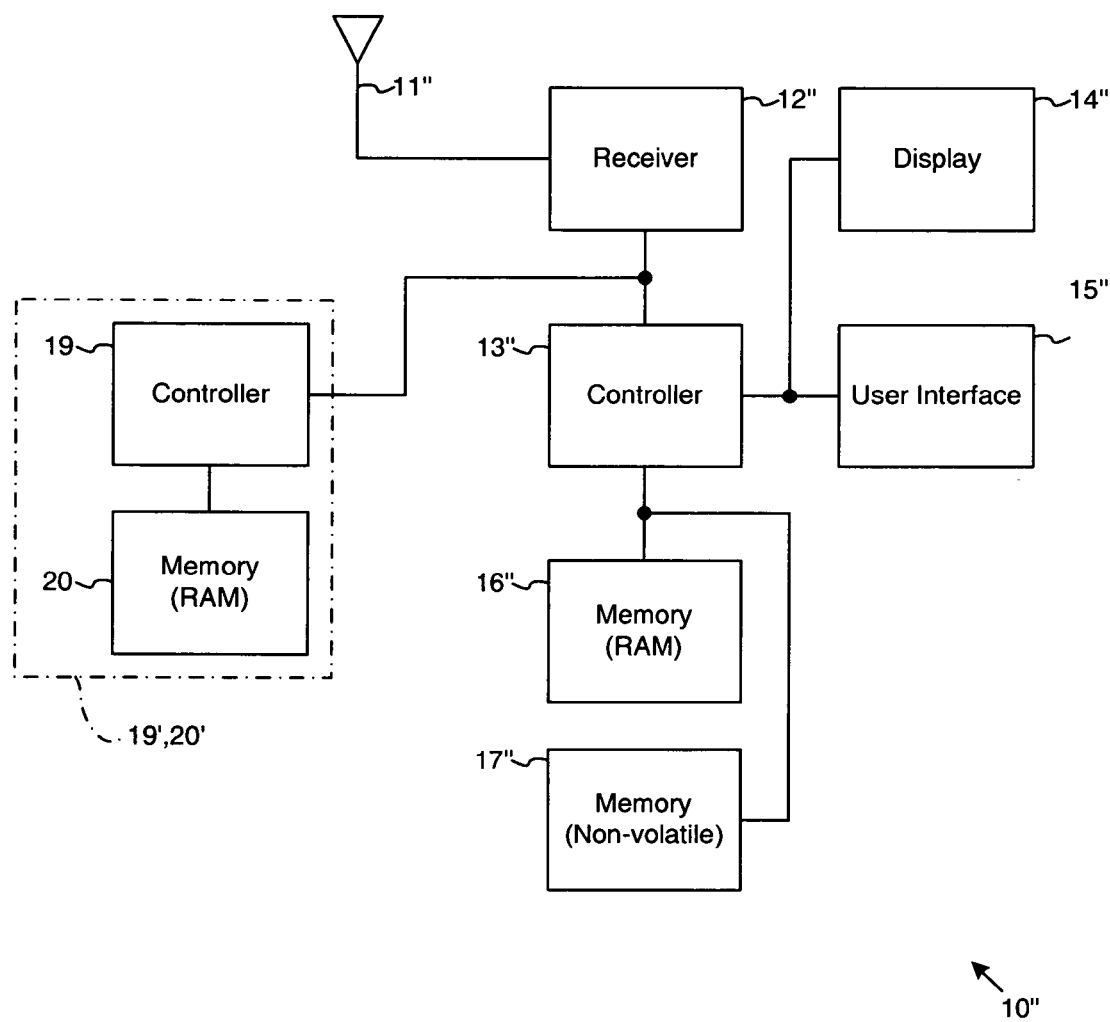
FIG. 16 is a block diagram of a mobile terminal according to at least some additional embodiments of the invention.

FIG. 16 is a block diagram of another mobile terminal 10" in which embodiments of the invention may be implemented. Mobile terminal 10" includes antenna 11", receiver 12", display 14", user interface 15" and non-volatile memory 17" which are generally similar to antenna 11, receiver 12, display 14, user interface 15 and non-volatile memory 17, respectively, of FIG. 2. Unlike mobile terminal 10 (FIG. 2), however, mobile terminal 10" includes a separate chipset including an additional controller 19 and additional memory 20. Controller 19 and memory 20 could alternately be combined into a single integrated circuit (IC) 19', 20' as shown with the broken line. Mobile terminal 10" operates in a manner similar to that described in connection with FIGS. 3-10 and/or 12-14, except that the buffering and error-correction functions are performed by controller 19 using memory 20. For example, the APDT buffer 52, RSDT buffer 54, supplemental buffer 56, mapping table 58 and error table 60 of FIGS. 3-10 are stored in memory 20, with controller 19 performing CRC checking, controlling burst data buffering, and performing RS error correction. Controller 19 forwards error-free application data which has passed a CRC check to processor 13", which then provides that data to an application stored in memory 16". Once corrupt data has been RS-corrected, controller 19 similarly forwards that data to controller 13". The embodiments of FIGS. 12-15 could similarly be implemented by controller 19.

Although specific examples of carrying out the invention have been described, those skilled in the art will appreciate that there are numerous variations and permutations of the above-described systems and methods that are contained within the spirit and scope of the invention as set forth in the appended claims. If, for example, all application data in a burst is received error-free (e.g., the CRC check is passed), RS data for that burst need not be stored. A mobile terminal could turn off its receiver while that RS data is transmitted in order to conserve power. The invention may also be implemented as a machine-readable medium having machine-executable instructions stored thereon such that, when the instructions are read and executed by an appropriate device (or devices), steps of a method according to the invention are performed. These and other modifications are within the scope of the invention as set forth in the attached claims. In the claims, various portions are prefaced with letter or number references for convenience. However, use of such references does not imply a temporal relationship not otherwise required by the language of the claims.

The invention claimed is:

1. A method comprising:
   (a) correcting errors in sets of payload data from a first data grouping after said first data grouping has been received, wherein
      the first data grouping is one of multiple data groupings,
      each of the multiple data groupings includes plural sets of payload data and plural sets of error correction data,
      each of the multiple data groupings is configured for arrangement in a predefined tabular format, the tabular format associating each of the plural payload data sets of a data grouping with a corresponding one of the plural error correction data sets in the same data grouping, with each of the plural error correction data sets usable to correct errors in its corresponding payload data set,
      each data grouping comprises a Multi-Protocol Encapsulation-Forward Error Correcting (MPE-FEC) data frame,
      the tabular format includes an application data table (APDT) having a first number of columns and up to a second number of rows, each row/column intersection in the APDT forming a cell holding one or more bits of data,
      the tabular format further includes a Reed-Solomon error correction data table (RSDT) having a third number of columns and the same number of rows as the APDT, each row/column intersection in the RSDT forming a cell holding one or more bits of data, and
      each row in the RSDT corresponds to a separate row in the APDT;
   (b) receiving payload data from a second data grouping subsequent to receipt of the first data grouping and prior to completion of (a); and
   (c) buffering the payload data from the second data grouping, pending completion of (a), without reservation of a buffer for said second data grouping having a capacity equal to or exceeding the maximum amount of payload and error correction data permitted by the tabular format in a single data grouping.

2. The method of claim 1, wherein the first number is 191, the second number is 1,024, the third number is 64, each APDT cell holds 8 bits, and each RSDT cell holds 8 bits.

3. The method of claim 1, wherein
   (a) comprises correcting errors in the payload data from the first data grouping, while that payload data is stored in a payload data buffer, using error correction data from the first data grouping stored in an error correction data buffer, and
   (c) comprises storing the payload data from the second data grouping in a supplemental buffer, and comprising
   (d) storing additional payload data from the second data grouping in the error correction data buffer.

4. The method of claim 3, comprising:
   (e) transferring the payload data stored in (c) and (d) to the payload data buffer after completion of (a).

5. The method of claim 1, comprising:
   (d) performing error checks on the payload data from the first data grouping prior to (a);
   (e) forwarding payload data found error-free in (d) to an application program; and
   (f) storing copies of data forwarded in (e) in a payload data buffer for use in (a).

6. The method of claim 5, comprising:
   (g) forwarding corrected payload data from the first data grouping to the application program upon completion of (a).

7. The method of claim 6, wherein
   (a) comprises correcting errors in the payload data from the first data grouping, while that payload data is stored in the payload data buffer, using error correction data from the first data grouping stored in an error correction data buffer, and
   (c) comprises storing the payload data from the second data grouping in a supplemental buffer, and further comprising:
   (h) storing additional payload data from the second data grouping in the error correction data buffer.

8. The method of claim 7, comprising:
   (i) transferring the payload data stored in (c) and (h) to the payload data buffer after completion of (a).

9. The method of claim 1, wherein (a) is performed without storing payload and error correction data from the first data grouping in the arrangement of the tabular format.

10. The method of claim 9, further comprising:
    (d) storing blocks of payload data from the first data grouping in a first collection of non-contiguous memory regions, each of the payload data blocks representing a separate column of payload data if the first data grouping is organized according to the tabular format; and
    (e) storing blocks of error correction data from the first data grouping in a second collection of non-contiguous memory regions, each of the error correction data blocks representing a separate column of error correction data if the first data grouping is organized according to the tabular format.

11. The method of claim 10, wherein (c) comprises storing blocks of payload data from the second data grouping in a third collection of non-contiguous memory regions, each of the second grouping payload data blocks representing a separate column of payload data if the second data grouping is organized according to the tabular format.

12. A non-transient machine-readable medium having stored thereon data representing sequences of instructions which, when executed by a processor, cause the processor to perform:
    (a) correcting errors in sets of payload data from a first data grouping after said first data grouping has been received, wherein
       the first data grouping is one of multiple data groupings,
       each of the multiple data groupings includes plural sets of payload data and plural sets of error correction data,
       each of the multiple data groupings is configured for arrangement in a predefined tabular format, the tabular format associating each of the plural payload data sets of a data grouping with a corresponding one of the plural error correction data sets in the same data grouping, with each of the plural error correction data sets usable to correct errors in its corresponding payload data set, each data grouping comprises a Multi-Protocol Encapsulation-Forward Error Correcting (MPE-FEC) data frame,
the tabular format includes an application data table (APDT) having a first number of columns and up to a second number of rows, each row/column intersection in the APDT forming a cell holding one or more bits of data,
the tabular format further includes a Reed-Solomon error correction data table (RSDT) having a third number of columns and the same number of rows as the APDT, each row/column intersection in the RSDT forming a cell holding one or more bits of data, and
each row in the RSDT corresponds to a separate row in the APDT;

(b) receiving payload data from a second data grouping subsequent to receipt of the first data grouping and prior to completion of (a); and (c) buffering the payload data from the second data grouping, pending completion of (a), without reservation of a buffer for said second data grouping having a capacity equal to or exceeding the maximum amount of payload and error correction data permitted by the tabular format in a single data grouping.

13. The machine-readable medium of claim 12, wherein the first number is 191, the second number is 1,024, the third number is 64, each APDT cell holds 8 bits, and each RSDT cell holds 8 bits.

14. The machine-readable medium of claim 12, wherein
(a) comprises correcting errors in the payload data from the first data grouping, while that payload data is stored in a payload data buffer, using error correction data from the first data grouping stored in an error correction data buffer, and
(c) comprises storing the payload data from the second data grouping in a supplemental buffer, and comprising additional instructions which, when executed by a processor, cause the processor to perform
(d) storing additional payload data from the second data grouping in the error correction data buffer.

15. The machine-readable medium of claim 14, comprising additional instructions which, when executed by a processor, cause the processor to perform:
(e) transferring the payload data stored in (c) and (d) to the payload data buffer after completion of (a).

16. The machine-readable medium of claim 12, comprising additional instructions which, when executed by a processor, cause the processor to perform:
(d) performing error checks on the payload data from the first data grouping prior to (a);
(e) forwarding payload data found error-free in (d) to an application program; and
(f) storing copies of data forwarded in (e) in a payload data buffer for use in (a).

17. The machine-readable medium of claim 16, comprising additional instructions which, when executed by a processor, cause the processor to perform:
(g) forwarding corrected payload data from the first data grouping to the application program upon completion of (a).

18. The machine-readable medium of claim 17, wherein
(a) comprises correcting errors in the payload data from the first data grouping, while that payload data is stored in the payload data buffer, using error correction data from the first data grouping stored in an error correction data buffer, and
(c) comprises storing the payload data from the second data grouping in a supplemental buffer, and comprising additional instructions which, when executed by a processor, cause the processor to perform
(h) storing additional payload data from the second data grouping in the error correction data buffer.

19. The machine-readable medium of claim 18, comprising additional instructions which, when executed by a processor, cause the processor to perform
(i) transferring the payload data stored in (c) and (h) to the payload data buffer after completion of (a).

20. The machine-readable medium of claim 12, wherein (a) is performed without storing payload and error correction data from the first data grouping in the arrangement of the tabular format.

21. The machine-readable medium of claim 20, comprising additional instructions which, when executed by a processor, cause the processor to perform
(d) storing blocks of payload data from the first data grouping in a first collection of non-contiguous memory regions, each of the payload data blocks representing a separate column of payload data if the first data grouping is organized according to the tabular format; and
(e) storing blocks of error correction data from the first data grouping in a second collection of non-contiguous memory regions, each of the error correction data blocks representing a separate column of error correction data if the first data grouping is organized according to the tabular format.

22. The machine-readable medium of claim 21, wherein (c) comprises storing blocks of payload data from the second data grouping in a third collection of non-contiguous memory regions, each of the second grouping payload data blocks representing a separate column of payload data if the second data grouping is organized according to the tabular format.

23. A device, comprising:
a memory; and
a controller programmed to perform a method of buffering payload data from data groupings, each data grouping including plural sets of payload data and plural sets of error correction data, each data grouping configured for arrangement in a predefined tabular format, the tabular format associating each of the plural payload data sets of a data grouping with a corresponding one of the plural error correction data sets in the same data grouping, with each of the plural error correction data sets usable to correct errors in its corresponding payload data set, each data grouping comprises a Multi-Protocol Encapsulation-Forward Error Correcting (MPE-FEC) data frame, the tabular format includes an application data table (APDT) having a first number of columns and up to a second number of rows, each row/column intersection in the APDT forming a cell holding one or more bits of data, the tabular format further includes a Reed-Solomon error correction data table (RSDT) having a third number of columns and the same number of rows as the APDT, each row/column intersection in the RSDT forming a cell holding one or more bits of data, each row in the RSDT corresponds to a separate row in the APDT, the method comprising
(a) correcting errors in sets of payload data from a first data grouping after said first data grouping has been received,
(b) receiving payload data from a second data grouping subsequent to receipt of the first data grouping and prior to completion of (a), and
(c) buffering in the memory the payload data from the second data grouping, pending completion of (a), without reservation of a buffer for said second data grouping having a capacity equal to or exceeding the maximum amount of payload and error correction data permitted by the tabular format in a single data grouping.

24. The device of claim 23, wherein the first number is 191, the second number is 1,024, the third number is 64, each APDT cell holds 8 bits, and each RSDT cell holds 8 bits.

25. The device of claim 23, wherein (a) comprises correcting errors in the payload data from the first data grouping, while that payload data is stored in a payload data buffer in the memory, using error correction data from the first data grouping stored in an error correction data buffer in the memory,
(c) comprises storing the payload data from the second data grouping in a supplemental buffer in the memory, and the controller is further programmed to perform
(d) storing additional payload data from the second data grouping in the error correction data buffer.

26. The device of claim 25, wherein the controller is further programmed to perform
(e) transferring the payload data stored in (c) and (d) to the payload data buffer after completion of (a).

27. The device of claim 23, wherein the controller is further programmed to perform
(d) performing error checks on the payload data from the first data grouping prior to (a),
(e) forwarding payload data found error-free in (d) to an application program, and
(f) storing copies of data forwarded in (e) in a payload data buffer within the memory for use in (a).

28. The device of claim 27, wherein the controller is further programmed to perform
(g) forwarding corrected payload data from the first data grouping to the application program upon completion of (a).

29. The device of claim 28, wherein
(a) comprises correcting errors in the payload data from the first data grouping, while that payload data is stored in the payload data buffer, using error correction data from the first data grouping stored in an error correction data buffer within the memory,
(c) comprises storing the payload data from the second data grouping in a supplemental buffer within the memory, and
the controller is further programmed to perform
(h) storing additional payload data from the second data grouping in the error correction data buffer.

30. The device of claim 29, wherein the controller is further programmed to perform
(i) transferring the payload data stored in (c) and (h) to the payload data buffer after completion of (a).

31. The device of claim 23, wherein (a) is performed without storing payload and error correction data from the first data grouping in the arrangement of the tabular format.

32. The device of claim 21, wherein the controller is further programmed to perform
(d) storing blocks of payload data from the first data grouping in a first collection of non-contiguous regions in the memory, each of the payload data blocks representing a separate column of payload data if the first data grouping is organized according to the tabular format, and
(e) storing blocks of error correction data from the first data grouping in a second collection of non-contiguous regions in the memory, each of the error correction data blocks representing a separate column of error correction data if the first data grouping is organized according to the tabular format.

33. The device of claim 32, wherein (c) comprises storing blocks of payload data from the second data grouping in a third collection of non-contiguous regions in the memory, each of the second grouping payload data blocks representing a separate column of payload data if the second data grouping is organized according to the tabular format.

34. The device of claim 23, wherein the controller and the memory are contained in a single integrated circuit.

35. The device of claim 23, wherein the device is a mobile terminal, and further comprising:
an antenna;
a receiver communicatively coupled to the antenna and to the controller;
a display communicatively coupled to the controller; and
a user interface communicatively coupled to the controller.

36. The device of claim 35, further comprising:
a second controller communicatively coupled to the first controller; and
a second memory communicatively coupled to the second controller.

37. An apparatus comprising:
one or more integrated circuits configured to perform
(a) correcting errors in sets of payload data from a first data grouping after said first data grouping has been received, wherein
the first data grouping is one of multiple data groupings,
each of the multiple data groupings includes plural sets of payload data and plural sets of error correction data, and
each of the multiple data groupings is configured for arrangement in a predefined tabular format, the tabular format associating each of the plural payload data sets of a data grouping with a corresponding one of the plural error correction data sets in the same data grouping, with each of the plural error correction data sets usable to correct errors in its corresponding payload data set;
(b) receiving payload data from a second data grouping subsequent to receipt of the first data grouping and prior to completion of (a); and
(c) buffering the payload data from the second data grouping, pending completion of (a), without reservation of a buffer for said second data grouping having a capacity equal to or exceeding the maximum amount of payload and error correction data permitted by the tabular format in a single data grouping.

38. The one or more integrated circuits of claim 37, wherein
each data grouping comprises a Multi-Protocol Encapsulation-Forward Error Correcting (MPE-FEC) data frame,
the tabular format includes an application data table (APDT) having a first number of columns and up to a second number of rows, each row/column intersection in the APDT forming a cell holding one or more bits of data,
the tabular format further includes a Reed-Solomon error correction data table (RSDT) having a third number of columns and the same number of rows as the APDT, each row/column intersection in the RSDT forming a cell holding one or more bits of data, and
each row in the RSDT corresponds to a separate row in the APDT.

39. The one or more integrated circuits of claim 37, wherein
  (a) comprises correcting errors in the payload data from the first data grouping, while that payload data is stored in a payload data buffer, using error correction data from the first data grouping stored in an error correction data buffer, and
  (c) comprises storing the payload data from the second data grouping in a supplemental buffer, and wherein the one or more integrated circuits are further configured to perform
  (d) storing additional payload data from the second data grouping in the error correction data buffer.

* * * * *